United States Patent
Guo et al.

(10) Patent No.: US 11,011,715 B2
(45) Date of Patent: May 18, 2021

(54) DISPLAY PANEL AND DISPLAY DEVICE

(71) Applicant: WuHAN TianMA Micro-electronics Co., Ltd., Wuhan (CN)

(72) Inventors: Linshan Guo, Shanghai (CN); Yinghua Mo, Shanghai (CN)

(73) Assignee: WUHAN TIANMA MICRO-ELECTRONICS CO., LTD., Wuhan (CN)

(*) Notice: Subject to any disclaimer, the term of this patent is extended or adjusted under 35 U.S.C. 154(b) by 36 days.

(21) Appl. No.: 16/591,141

(22) Filed: Oct. 2, 2019

(65) Prior Publication Data

US 2020/0328363 A1 Oct. 15, 2020

(30) Foreign Application Priority Data

Apr. 15, 2019 (CN) .......................... 201910298810.2

(51) Int. Cl.
*H01L 51/00* (2006.01)
*G06F 3/041* (2006.01)
*H01L 23/498* (2006.01)

(52) U.S. Cl.
CPC ........ *H01L 51/0097* (2013.01); *G06F 3/0412* (2013.01); *H01L 23/4985* (2013.01); *H01L 2251/5338* (2013.01)

(58) Field of Classification Search
CPC combination set(s) only.
See application file for complete search history.

(56) References Cited

U.S. PATENT DOCUMENTS

2018/0329554 A1* 11/2018 Beak ..................... G06F 3/0412
2018/0348937 A1* 12/2018 Pak ....................... G06F 3/0446

* cited by examiner

*Primary Examiner* — Ratisha Mehta
(74) *Attorney, Agent, or Firm* — Alston & Bird LLP

(57) ABSTRACT

A display panel includes a thin film encapsulation layer which has a stack of layers: an organic encapsulation layer and an inorganic encapsulation layer covering the organic encapsulation layer; an inorganic insulation layer; also first touch electrodes; and first bridge structures. First and second recessed structures that are connected to each other are formed in the inorganic encapsulation layer and the inorganic insulation layer in one arrangement, or the first and second recessed structures are provided in the inorganic insulation layer in another arrangement. The first touch electrode and the first bridge structure are located in the first recessed structure and the second recessed structure, or the first bridge structure and the first touch electrode are located in the first recessed structure and the second recessed structure. The first touch electrode serves as a touch driving electrode or touch sensing electrode, and two first touch electrodes are electrically connected to each other through one first bridge structure.

20 Claims, 13 Drawing Sheets

DISPLAY PANEL AND DISPLAY DEVICE

CROSS-REFERENCE TO RELATED APPLICATIONS

The present application claims priority to Chinese Patent Application No. CN 201910298810.2, filed at CNIPA on Apr. 15, 2019, the content of which is incorporated herein by reference in its entirety.

TECHNICAL FIELD

The present disclosure relates to the technical field of display technologies, and in particular, to a display panel and a display device.

BACKGROUND

Breakthroughs have been made in display technologies in areas of display screens. Flexible display devices have attracted much attention from its low thickness and flexibility. A touch flexible display panel combines the advantages of the touch technology and the flexible display technology, and thus can be deformable or bendable, so a user is able to directly operate it by a finger or a touch pen in ways very comfortable and convenient that are not seen before. However, there has been a problem where the touch electrodes are prone to break or crack during bending.

SUMMARY

In an aspect, an embodiment of the present disclosure provides a display panel, including: a flexible substrate; a driving circuit layer disposed on the flexible substrate; an organic light-emitting layer disposed on the driving circuit layer; a thin film encapsulation layer disposed on organic light-emitting layer including an organic encapsulation layer and an inorganic encapsulation layer covering the organic encapsulation layer; an inorganic insulation layer disposed on the thin film encapsulation layer; a first recessed structure and a second recessed structure formed connecting to each other; first touch electrodes; and first bridge structures. The first recess structure each is formed in the inorganic encapsulation layer and the second recess structures each is formed in the inorganic insulation layer; or wherein the first recessed structures and the second recessed structures are both formed in the inorganic insulation layer. The first touch electrodes each is located in one of the first recessed structures and wherein the first bridge structures each is located in one of the second recessed structures, or the first bridge structures each is located in one of the first recessed structures and the first touch electrodes each is located in one of the second recessed structures. The first touch electrodes each serves as a touch driving electrode or a touch sensing electrode. Two of the first touch electrodes are electrically connected to each other through one of the first bridge structures.

In another aspect, an embodiment of the present disclosure provides a display device including the display panel described above.

BRIEF DESCRIPTION OF DRAWINGS

In order to more clearly illustrate embodiments of the present disclosure, the accompanying drawings used in the embodiments and in the related art are briefly introduced as follows. It should be noted that the drawings described as follows are merely part of the embodiments of the present disclosure, and other drawings can also be acquired by those skilled in the art without paying creative efforts.

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

It should be understood that although devices may be described using the terms of "first", "second", etc., in the embodiments of the present disclosure, the devices will not be limited to these terms. These terms are merely used to distinguish the devices from one another. For example, without departing from the scope of the embodiments of the present disclosure, a first device may also be referred to as a second device, and similarly, a second device may also be referred to as a first device.

Figure 1:
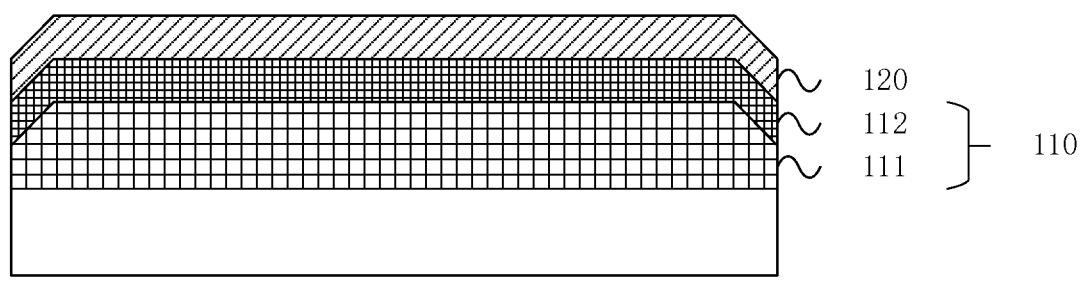
FIG. 1 is a schematic diagram of a display panel structure 100 in the related art.

FIG. 1 is a schematic diagram of a structure of a display panel 100 in the related art.

As shown in FIG. 1, in the related art, the display panel 100 includes a thin film encapsulation layer 110 and a touch electrode layer 120. The thin film encapsulation layer 110 includes at least one organic encapsulation layer 111 and at least one inorganic encapsulation layer 112. The organic encapsulation layer 111, the inorganic encapsulation layer 112 and the touch electrode layer 120 are sequentially disposed. The organic encapsulation layer 111 is manufactured by an inkjet printing process, and a slope is formed at an edge of the organic encapsulation layer 111 due to fluidity of an organic material during inkjet printing. The inorganic encapsulation layer 112 is formed on the organic encapsulation layer 111, and a slope is formed at an edge of the inorganic encapsulation layer 112. The touch electrode layer 120 is formed on the inorganic encapsulation layer 112, and an edge of the touch electrode layer 120 is thin and easily broken due to the slope at the edge.

In order to solve the above technical problems, the present disclosure provides a display panel and a display device.

Figure 2:
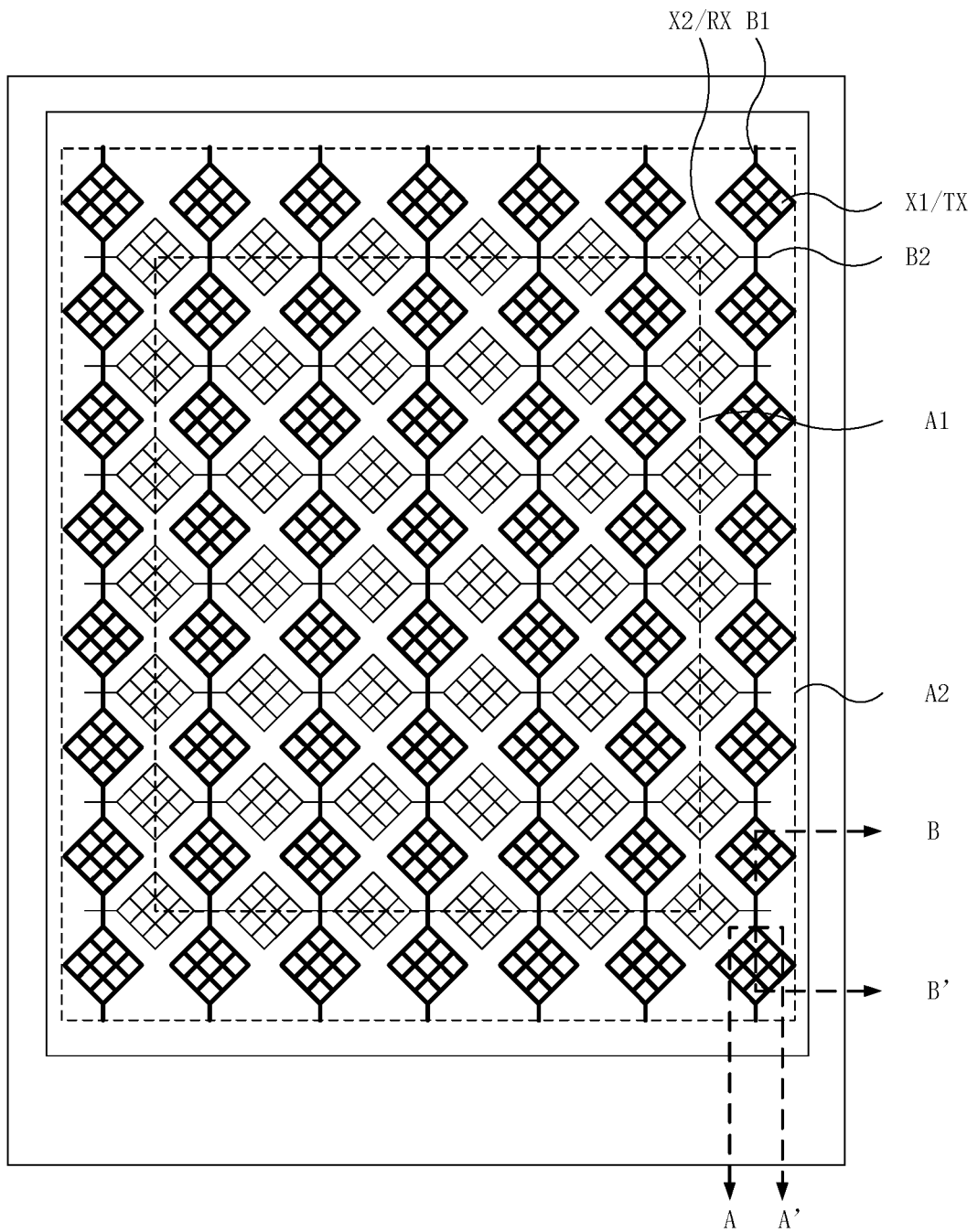
FIG. 2 is a schematic diagram of a display panel structure 200 according to an embodiment of the present disclosure.
Figure 3:
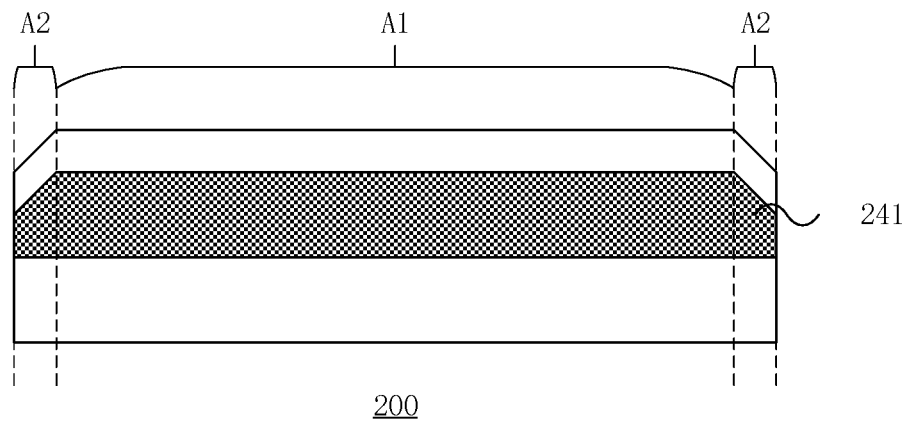
FIG. 3 is a schematic diagram of another display panel structure 200 according to an embodiment of the present disclosure.
Figure 4A:
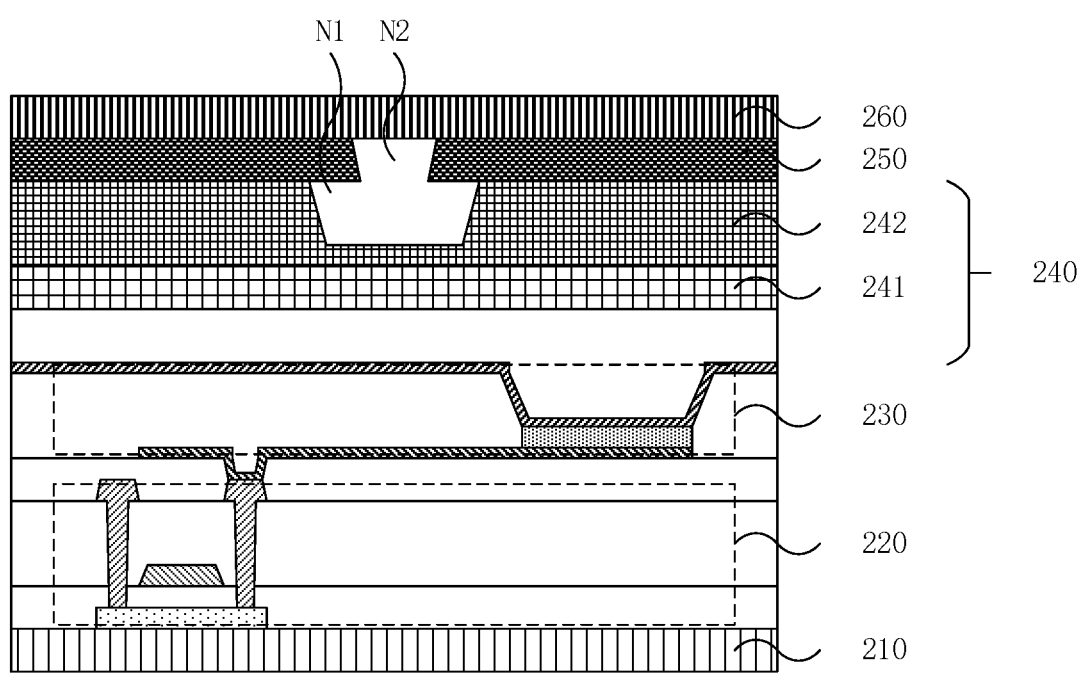
FIG. 4A and FIG. 4B each is a schematic diagram of the display panel structure 200 shown in FIG. 2 along AA', according to an embodiment of the present disclosure.
Figure 4B:
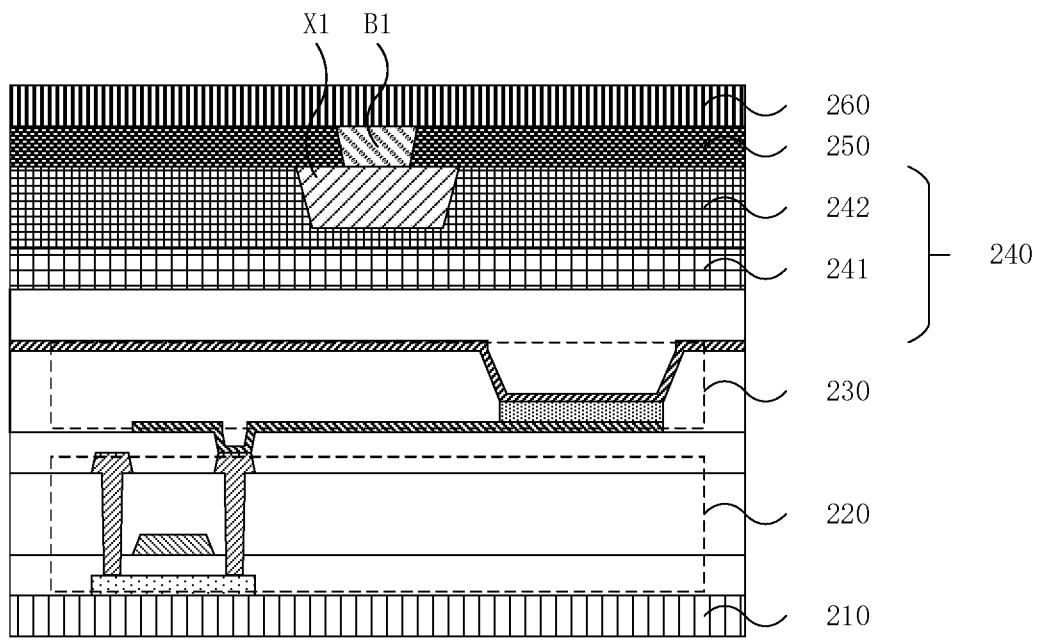
Figure 4C:
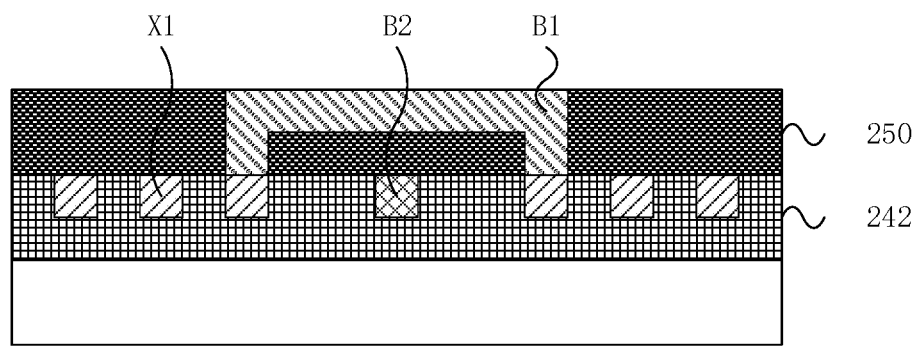
FIG. 4C is a schematic diagram of the display panel structure 200 shown in FIG. 2 along BB' according to an embodiment of the present disclosure.

FIG. 2 is a schematic diagram of a structure of a display panel 200 according to an embodiment of the present disclosure, FIG. 3 is a schematic diagram of another structure of a display panel 200 according to another embodiment of the present disclosure, FIG. 4A and FIG. 4B each are a schematic diagram of a structure of the display panel 200 shown in FIG. 2 along AA' according to an embodiment of the present disclosure, and FIG. 4C is a schematic diagram of a structure of the display panel 200 shown in FIG. 2 along BB' according to an embodiment of the present disclosure. With reference to FIGS. 2-3 and FIGS. 4A-4C, the display panel 200 includes a flexible substrate 210, a driving circuit layer 220, an organic light-emitting layer 230, a thin film encapsulation layer 240, and an inorganic insulation layer 250 that are sequentially stacked. The thin film encapsulation layer 240 includes an organic encapsulation layer 241 and an organic encapsulation layer 242 covering the organic encapsulation layer 241. The inorganic encapsulation layer 242 is adjacent to the inorganic insulation layer 250. The inorganic encapsulation layer 242 has a first recessed structure N1, and the inorganic insulation layer 250 has a second recessed structure N2 that is connected to the first recessed structure N1; or the inorganic insulation layer 250 has a first recessed structure N1 and a second recessed structure N2 that are connected to each other. The display panel 200 further includes a first touch electrode X1 located in the first recessed structure N1 and a first bridge structure B1 located in the second recessed structure N2; or the display panel 200 further includes a first bridge structure B1 located in the first recessed structure N1 and a first touch electrode X1 located in the second recessed structure N2. The first touch electrode X1 serves as a touch driving electrode TX or a touch sensing electrodes RX. Two first touch electrodes X1 are electrically connected to each other through one first bridge structure B1.

With reference to FIG. 4A to FIG. 4B, in an embodiment of the present disclosure, the inorganic encapsulation layer 242 has a first recessed structure N1, and the inorganic insulation layer 250 has a second recessed structure N2; a first touch electrode X1 is located in the first recessed structures N1, and a first bridge structure B1 is located in the second recessed structures N2. In another embodiment of the present disclosure, the inorganic encapsulation layer 242 has a first recessed structure N1, and the inorganic insulation layer 250 has a second recessed structure N2; a first bridge structure B1 is located in the first recessed structure N1, and a first touch electrode X1 is located in the second recessed structure N2. In still another embodiment of the present disclosure, the inorganic encapsulation layer 242 has a first recessed structure N1, and the inorganic insulation layer 250 has a second recessed structure N2; a first touch electrode X1 is located in the first recessed structure N1, and a first bridge structure B1 is located in the second recessed structure N2 and/or the first recessed structure N1. In yet another embodiment of the invention, the inorganic encapsulation layer 242 has a first recessed structure N1, and the inorganic insulation layer 250 has a second recessed structure N2; a first bridge structure B1 is located in the first recessed structure N1, and a first touch electrode X1 is located in the second recessed structure N2 and/or the first recessed structure N1. In yet another embodiment of the present disclosure, the inorganic insulation layer 250 has a first recessed structure N1 and a second recessed structure N2; a first touch electrode X1 is located in the first recessed structure N1, and a first bridge structure B1 is located in the second recessed structure N2.

In an embodiment of the present disclosure, the organic encapsulation layer 241, the inorganic encapsulation layer 242, and the inorganic insulation layer 250 are sequentially stacked. The inorganic encapsulation layer 242 has a first recessed structure N1 and the inorganic insulation layer 250 has a second recessed structure N2; or the inorganic insulation layer 250 has a first recessed structure N1 and a second recessed structure N2. The first touch electrode X1 is located in the first recessed structure N1, and the first bridge structure B1 is located in the second recessed structure N2; or the first bridge structure B1 is located in the first recessed structure N1, and the first touch electrode X1 is located in the second recessed structure N2. The organic encapsulation layer 241 has a slope area and a horizontal area. Same first recessed structures N1 are provided in the inorganic encapsulation layer 242 located above the slope area of the organic encapsulation layer 241 and the inorganic encapsulation layer 242 located above the horizontal area of the organic encapsulation layer 241, and same second recessed structures N2 are provided in the inorganic insulation layer 250 located above the slope area of the organic encapsulation layer 241 and the inorganic insulation layer 250 located above the horizontal area of the organic encapsulation layer 241; and alternatively, same first recessed structures N1 are provided in the inorganic insulation layer 250 located above the slope area of the organic encapsulation layer 241 and the inorganic insulation layer 250 located above the horizontal area of the organic encapsulation layer 241, and same second recessed structures N2 are provided in the inorganic insulation layer 250 located above the slope area of the organic encapsulation layer 241 and the inorganic insulation layer 250 located above the horizontal area of the organic encapsulation layer 241. Same first touch electrodes X1 are disposed respectively in the first recessed structures N1 located above the slope area and the horizontal area of the organic encapsulation layer 241, and same first bridge structures B1 are disposed respectively in the second recessed structures N2 located above the slope area and the horizontal area of the organic encapsulation layer 241; and alternatively, same first bridge structures B1 are disposed respectively in the first recessed structures N1 located above the slope area and the horizontal area of the organic encapsulation layer 241, and same first touch electrodes X1 are disposed respectively in the second recessed structures N2 located above the slope area and the horizontal area of the organic encapsulation layer 241. All the first touch electrodes X1 are embedded into the inorganic encapsulation layer 242 or the inorganic insulation layer 250, and have same cross-sectional areas and same mechanical strengths. This can prevent the first touch electrode X1 located above the slope area of the organic encapsulation layer 241 from being too thin and too narrow, which would otherwise result in that the first touch electrode X1 is easily broken. All the first bridge structures B1 are embedded into the inorganic encapsulation layer 242 or the inorganic insulation layer 250, and have same cross-sectional areas and same mechanical strengths. This can prevent the first bridge structure B1 located above the slope area of the organic encapsulation layer 241 from being too thin and too narrow, which would otherwise result in that the first bridge structure B1 is easily broken.

In this embodiment of the present disclosure, the first touch electrode X1 is embedded into the inorganic encapsulation layer 242 or the inorganic insulation layer 250, instead of being embedded into the organic encapsulation layer 241. A minimum distance between the inorganic encapsulation layer 242 and the driving circuit layer 220 or a minimum distance between the inorganic insulation layer 250 and the driving circuit layer 220 is larger than a minimum distance between the organic encapsulation layer 241 and the driving circuit layer 220. There is small mutual interference between the first touch electrode X1 and the driving circuit layer 220. The first touch electrode X1 is embedded into the inorganic encapsulation layer 242 or the inorganic insulation layer 250, instead of being disposed on a flat surface of the inorganic encapsulation layer 242 or the inorganic insulation layer 250. An overall thickness of the first touch electrode X1 and the inorganic encapsulation layer 242 is smaller than a sum of a thickness of the first touch electrode X1 and a thickness of the inorganic encapsulation layer 242; or an overall thickness of the first touch electrode X1 and the inorganic insulation layer 250 is smaller than a sum of the thickness of the first touch electrode X1 and a thickness of the inorganic insulation layer 250. In this case, the display panel 200 is relatively thin and light.

With reference to FIG. 2 and FIG. 3, the display panel 200 has a central display area A1 and an edge display area A2 surrounding the central display area A1. The organic encapsulation layer 241 is located in the central display area A1 and the edge display area A2. A ratio of a thickness of the organic encapsulation layer 241 located in the edge display area A2 to a thickness of the organic encapsulation layer 241 located in the central display area A1 is larger than 0.5 and smaller than 1.

In this embodiment of the present disclosure, the organic encapsulation layer 241 is manufactured by an inkjet printing process and is formed in central display area A1 and the edge display area A2. The organic encapsulation layer 241 located in the central display area A1 is horizontal, and the organic encapsulation layer 241 located in the edge display area A2 is oblique. The ratio of the thickness of the organic encapsulation layer 241 located in the edge display area A2 to the thickness of the organic encapsulation layer 241 located in the central display area A1 is larger than 0.5 and smaller than 1. Both the organic encapsulation layer 241 located in the central display area A1 and the organic encapsulation layer 241 located in the edge display area A2 can relieve stress and cover particles.

With reference to FIG. 3 and FIGS. 4A-4B, a structure of the edge display area A2 is illustrated in FIGS. 4A-4B, and so is a structure of the central display area A1. However, the thickness of the organic encapsulation layer 241 located in the edge display area A2 is smaller than the thickness of the organic display layer 241 located in the central display area A1. The inorganic encapsulation layer 242 and the inorganic insulation layer 250 are located in the central display area A1 and in the edge display area A2. A width or thickness of the first touch electrode X1 located in the central display area A1 is equal to a width or thickness of the first touch electrode X1 located in the edge display area A2. A width or thickness of the first bridge structure B1 located in the central display area A1 is equal to a width or thickness of the first bridge structure B1 located in the edge display area A2.

In an embodiment of the present disclosure, the organic encapsulation layer 241 located in the central display area A1 is horizontal, and the organic encapsulation layer 241 located in the edge display area A2 is oblique. The inorganic encapsulation layer 242 located above the organic encapsulation layer 241 located in the central display area A1 and the inorganic encapsulation layer 242 located above the organic encapsulation layer 241 located in the edge display area A2 are provided with first recessed structures N1 that have same widths and same depths, and the inorganic insulation layer 250 located above the organic encapsulation layer 241 located in the central display area A1 and the inorganic insulation layer 250 located above the organic encapsulation layer 241 located in the edge display area A2 are provided with second recessed structures N2 that have same widths and same depths. Alternatively, the inorganic insulation layer 250 located above the organic encapsulation layer 241 located in the central display area A1 and the inorganic insulation layer 250 located above the organic encapsulation layer 241 located in the edge display area A2 are provided with first recessed structures N1 having same widths and same depths and with second recessed structures N2 having same widths and same depths. Moreover, in the central display area A1, the first touch electrodes X1 which share the same widths and the same thicknesses are provided in the first recessed structure N1, above the organic encapsulation layer 241. In the edge display area A2, the first recessed structure N1 is located above the organic encapsulation layer 241. The first bridge structures B1 that have in the central display area A1 the same widths and same thicknesses are built in the second recessed structure N2 above the organic encapsulation layer 241 and in the second recessed structure N2 located above the organic encapsulation layer 241 located in the edge display area A2. Alternatively, in the central display area A1, the first bridge structures B1 which share the same widths and same thicknesses are provided in the first recessed structure N1 located above the organic encapsulation layer 241. In the edge display area A2, the first recessed structure N1 is located above the organic encapsulation layer 241. In the central display area A1 the first touch electrodes X1 that have the same widths and same thicknesses are built in the second recessed structure N2 above the organic encapsulation layer 241. In the edge display area A2, the second recessed structure N2 above the organic encapsulation layer 241. All the first touch electrodes X1 are embedded into the inorganic encapsulation layer 242 or in inorganic insulation layer 250, and have same cross-sectional areas and same mechanical strengths. This can prevent the first touch electrode X1 located above the organic encapsulation layer 241 located in the edge display area A2 from being too thin and too narrow, which would otherwise result in that the first touch electrode X1 is easily broken. All the first bridge structures B1 are embedded into the inorganic encapsulation layer 242 or in the inorganic insulation layer 250, and have same cross-sectional areas and same mechanical strengths. This can prevent the first bridge structures B1 located above the organic encapsulation layer 241 located in the edge display area A2 from being too thin and too narrow, which would otherwise result in that the first bridge structures B1 is easily broken. With reference to FIGS. 2, 3 and 4C, a structure of the edge display area A2 is as shown in FIG. 4C, and so is a structure of the central display area A1. However, a thickness of the organic encapsulation layer 241 located in the edge display area A2 is smaller than a thickness of the organic encapsulation layer 241 located in the central display area A1. The display panel 200 further includes a second touch electrode X2 and a second bridge structure B2. Two second touch electrodes X2 are electrically connected to each other through one second bridge structure B2. The first touch electrode X1 and the second touch electrode X2 are located in a same film layer. The first bridge structure B1 crosses the second bridge structure B2. The first touch electrode X1 and the second touch electrode X2 respectively serve as a touch driving electrode TX and a touch sensing electrode RX.

In this embodiment of the present disclosure, the touch driving electrode TX is electrically connected to a touch chip, and the touch sensing electrode RX is electrically connected to the touch chip. The touch driving electrode TX and the touch sensing electrode RX form a capacitance. The touch chip transmits to touch driving signal to the touch driving electrode TX, and the touch driving signal transmitted to the touch driving electrode TX causes the touch sensing electrode RX to generate a touch sensing signal under capacitance coupling. Then, the touch chip detects the touch sensing signal generated by the touch sensing electrode RX. The touch chip determines a capacitance between the touch driving electrode TX and the touch sensing electrode RX according to the touch driving signal and the touch sensing signal, thereby determining a touch event related thereto.

With reference to FIG. 2 and FIG. 4C, the first touch electrodes X1 and the second touch electrodes X2 form a metal mesh.

In this embodiment of the present disclosure, the first touch electrodes X1 and the second touch electrodes X2 form a metal mesh, and they have excellent light-transmission performance and bending performance.

With reference to FIG. 3 and FIG. 4A, a structure of the edge display area A2 is as shown in FIG. 4A, and so is a structure of the central display area A1. However, a thickness of the organic encapsulation layer 241 located in the edge display area A2 is smaller than a thickness of the organic encapsulation layer 241 located in the central display area A1. The inorganic insulation layer 250 is located at a side of the inorganic encapsulation layer 242. The inorganic encapsulation layer 242 has a first recessed structure N1, and the inorganic insulation layer 250 has a second recessed structure N2. The thickness of the inorganic encapsulation layer 242 is larger than the depth of the first recessed structure N1, and the thickness of the inorganic insulation layer 250 is equal to the depth of the second recessed structure N2.

In this embodiment of the present disclosure, the inorganic insulation layer 250 is located at a side of the inorganic encapsulation layer 242, the inorganic encapsulation layer 242 has a first recessed structure N1, and the inorganic insulation layer 250 has a second recessed structure N2. Here, the inorganic insulation layer 250 is located at a side of the inorganic encapsulation layer 242 and covers an entirety of the inorganic encapsulation layer 242, instead of being embedded into the inorganic encapsulation layer 242 and covering only a part of the inorganic encapsulation layer 242. The inorganic insulation layer 250 has an excellent effect of preventing water and oxygen. The inorganic insulation layer 250 includes one film layer and is manufactured by a process for one film layer, instead of including two film layers and being manufactured by a process for two film layers. The inorganic insulation layer 250 is easily manufactured.

In an embodiment of the present disclosure, the thickness of the inorganic encapsulation layer 242 refers to a dimension of the inorganic encapsulation layer 242 in a vertical direction of the flexible substrate 210. The depth of the first recessed structure N1 refers to a dimension of the first recessed structure N1 in the vertical direction of the flexible substrate 210. The thickness of the inorganic insulation layer 250 refers to a dimension of the inorganic insulation layer 250 in the vertical direction of the flexible substrate 210. The depth of the second recessed structure N2 refers to a dimension of the second recessed structure N2 in the vertical direction of the flexible substrate 210. The inorganic encapsulation layer 242 has the first recessed structure N1, and the thickness of the inorganic encapsulation layer 242 is larger than the depth of the first recessed structure N1. The inorganic encapsulation layer 242 is closed at a bottom of the first recessed structure N1 to prevent water and oxygen, thereby preventing the inorganic encapsulation layer 242 from hollowing out at the first recessed structure N1. The inorganic insulation layer 250 has the second recessed structure N2. The thickness of the inorganic insulation layer 250 is equal to the depth of the second recessed structure N2 instead of being larger than the depth of the second recessed structure N2. The thickness of the inorganic insulation layer 250 is small. In this case, the display panel 200 is relatively thin and light. With reference to FIGS. 3, 4A, and 4B, a structure of the edge display area A2 is as shown in FIGS. 4A and 4B, and so is a structure of the central display area A1. However, the thickness of the organic encapsulation layer 241 located in the edge display area A2 is smaller than the thickness of the organic encapsulation layer 241 located in the central display area A1. The first touch electrode X1 is located in the first recessed structure N1, and the thickness of the first touch electrode X1 is equal to the depth of the first recessed structure N1.

In this embodiment of the present disclosure, the thickness of the first touch electrode X1 refers to a dimension of the first touch electrode X1 in a vertical direction of a bottom of the first recessed structure N1. The inorganic encapsulation layer 242 has the first recessed structure N1, and the first touch electrode X1 is located in the first recessed structure N1. The thickness of the first touch electrode X1 is equal to the depth of the first recessed structure N1. An upper surface of the first touch electrode X1 is substantially flush with an upper surface of the inorganic encapsulation layer 242, and the first touch electrode X1 fills an entirety of the first recessed structure N1. The first touch electrode X1 prevents water and oxygen from accumulating in the first recessed structure N1.

Figure 5A:
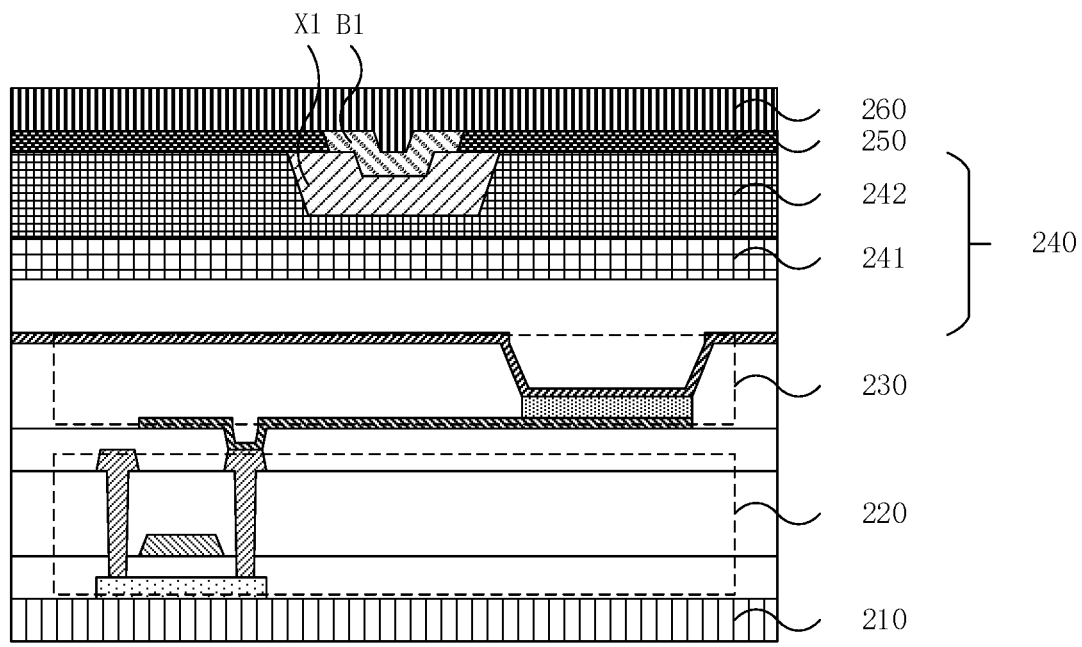
FIG. 5A is a schematic diagram of another display panel structure 200 shown in FIG. 2 along AA' according to an embodiment of the present disclosure.

FIG. 5A is a schematic diagram of another structure of the display panel 200 shown in FIG. 2 along AA' according to an embodiment of the present disclosure.

With reference to FIGS. 2 and 3 and FIGS. 4A and 5A, a structure of the edge display area A2 is as shown in FIGS. 4A and 5A, and so is a structure of the central display area A1. However, a thickness of the organic encapsulation layer 241 located in the edge display area A2 is smaller than a thickness of the organic encapsulation layer 241 located in the central display area A1. The first touch electrode X1 is located in the first recessed structure N1, and the thickness of the first touch electrode X1 is smaller than a depth of the first recessed structure N1.

In this embodiment of the present disclosure, the thickness of the first touch electrode X1 refers to a dimension of the first touch electrode X1 in a vertical direction of a bottom or a side wall of the first recessed structure N1. The inorganic encapsulation layer 242 has the first recessed structure N1, and the first touch electrode X1 is located in the first recessed structure N1. The thickness of the first touch electrode X1 is smaller than the depth of the first recessed structure N1, instead of being equal to the depth of the first recessed structure N1. The first touch electrode X1 is of a U-shaped structure in the first recessed structure N1 instead of a straight line structure, and the U-shaped structure has two additional side portions compared with the straight line structure. The first touch electrode X1 has a large cross-sectional area and the first touch electrode X1 has a small electrical resistivity.

With reference to FIGS. 3, 4A, 4B and 5A, a structure of the edge display area A2 is as shown in FIGS. 4A, 4B and 5A, and so is a structure of the central display area A1. However, a thickness of the organic encapsulation layer 241 located in the edge display area A2 is smaller than a thickness of the organic encapsulation layer 241 located in the central display area A1. The first bridge structure B1 is located in the second recessed structure N2 or located in both the first recessed structure N1 and the second recessed structure N2. The thickness of the first bridge structure B1 is equal to the depth of second recessed structure N2.

In an embodiment of the present disclosure, the inorganic encapsulation layer 242 has the first recessed structure N1, and the inorganic insulation layer 250 has the second recessed structure N2. The first recessed structure N1 is connected to the second recessed structure N2. The first touch electrode X1 is located in the first recessed structure N1. The thickness of the first touch electrode X1 is equal to the depth of the first recessed structure N1. An upper surface of each of the first touch electrode X1 is substantially flush with an upper surface of the inorganic encapsulation layer 242. The first bridge structure B1 is located in the second recessed structure N2. The first bridge structure B1 is located above the first touch electrode X1 and is in contact with the first touch electrode X1. All the first touch electrodes X1 are embedded into the organic encapsulation layer 242, and have same cross-sectional areas and same mechanical strengths. All the first bridge structures B1 are embedded into the inorganic insulation layer 250, and have same cross-sectional areas and same mechanical strengths.

In an embodiment of the present disclosure, the inorganic encapsulation layer 242 has the first recessed structure N1, and the inorganic insulation layer 250 has the second recessed structure N2. The first recessed structure N1 is connected to the second recessed structure N2. The first touch electrode X1 is located in the first recessed structure N1, and the thickness of the first touch electrode X1 is smaller than the depth of the first recessed structure N1. The first touch electrodes X1 fills a part of the first recessed structure N1. The first bridge structure B1 is located in the first recessed structure N1 and the second recessed structure N2. The first bridge structure B1 is located above the first touch electrode X1 and is in contact with the first touch electrode X1. All the first touch electrodes X1 are embedded into the organic encapsulation layer 242, and have same cross-sectional areas and same mechanical strengths. All the first bridge structures B1 are embedded into the inorganic encapsulation layer 242 and the inorganic insulation layer 250, and have same cross-sectional areas and same mechanical strengths.

In this embodiment of the present disclosure, the thickness of the first bridge structure B1 refers to a dimension of the first bridge structure B1 in a vertical direction of the flexible substrate 210. The first bridge structure B1 is embedded into the inorganic insulation layer 250. The first touch electrode X1 is embedded into the inorganic encapsulation layer 242, instead of being embedded into the inorganic insulation layer 250. The thickness of the first bridge structure B1 is equal to the depth of the second recessed structure N2, the depth of the second recessed structure N2 is equal to a thickness of the inorganic insulation layer 250, and thus the thickness of the inorganic insulation layer 250 is equal to the thickness of the first bridge structure B1. The thickness of the first bridge structure B1 is smaller than the thickness of the first touch electrode X1, and thus the thickness of the inorganic insulation layer 250 is smaller than the thickness of the first touch electrode X1. In this way, the display panel 200 is relatively thin and light.

Figure 5B:
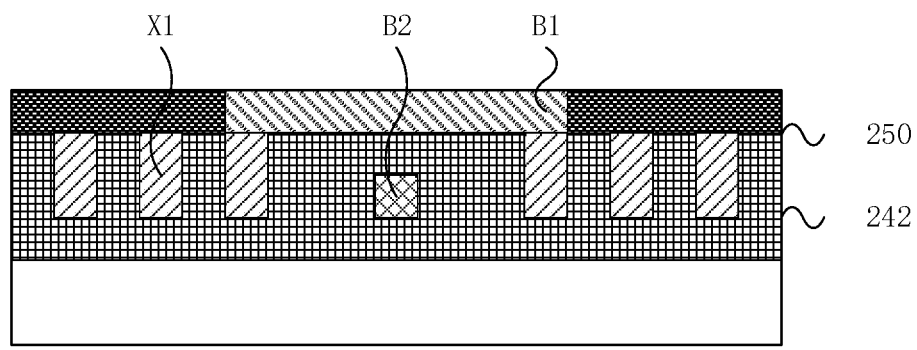
FIG. 5B is a schematic diagram of another display panel structure 200 shown in FIG. 2 along BB' according to an embodiment of the present disclosure.

FIG. 5B is a schematic diagram of another structure of the display panel 200 shown in FIG. 2 along BB' according to an embodiment of the present disclosure.

With reference to FIG. 2 and FIG. 5B, a structure of the edge display area A2 is shown in FIG. 5B, and so is a structure of the central display area A1. However, a thickness of the organic encapsulation layer 241 located in the edge display area A2 is smaller than a thickness of the organic encapsulation layer 241 located in the central display area A1. The display panel 200 further includes a second touch electrode X2 and a second bridge structure B2. Two second touch electrodes X2 are electrically connected to each other through one second bridge structure B2. The first touch electrode X1 and the second touch electrode X2 are located in a same film layer. The first bridge structure B1 crosses the second bridge structure B2. The first touch electrode X1 and the second touch electrode X2 respectively serve as a touch driving electrode TX and a touch sensing electrode RX.

In this embodiment of the present disclosure, the touch driving electrode TX is electrically connected to a touch chip, and the touch sensing electrode RX is electrically connected to the touch chip. The touch driving electrode TX and the touch sensing electrode RX form a capacitance. The touch chip transmits to touch driving signal to the touch driving electrode TX, and the touch driving signal transmitted to the touch driving electrode TX causes the touch sensing electrode RX to generate a touch sensing signal under capacitance coupling. Then, the touch chip detects the touch sensing signal generated by the touch sensing electrode RX. The touch chip determines the capacitance between the touch driving electrode TX and the touch sensing electrode RX according to the touch driving signal and the touch sensing signal, thereby determining a touch event related thereto.

Figure 6:
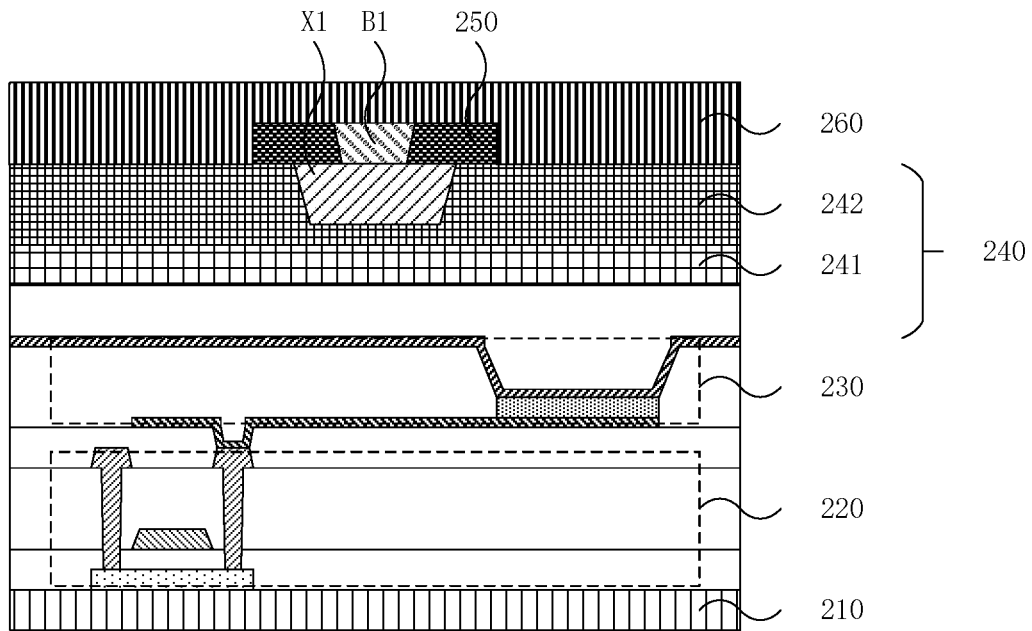
FIG. 6 is a schematic diagram of still another display panel structure 200 shown in FIG. 2 along AA' according to an embodiment of the present disclosure.

FIG. 6 is a schematic diagram of still another structure of the display panel 200 shown in FIG. 2 along AA' according to an embodiment of the present disclosure.

With reference to FIG. 3 and FIG. 6, a structure of the edge display area A2 is as shown in FIG. 6, and so is a structure of the central display area A1. However, a thickness of the organic encapsulation layer 241 located in the edge display area A2 is smaller than a thickness of the organic encapsulation layer 241 located in the central display area A1. The inorganic insulation layer 250 covers a part of the first recessed structure N1 close to the inorganic encapsulation layer 242.

In this embodiment of the present disclosure, the inorganic insulation layer 250 covers a part of the inorganic encapsulation layer 242 close to the first recessed structure N1, without covering another part of the inorganic encapsulation layer 242 facing away from the first recessed structure N1. A surface area of the inorganic insulation layer 250 is smaller than a surface area of the inorganic encapsulation layer 242. The inorganic insulation layer 250 is subjected to a small force when being bent, and thus the inorganic insulation layer 250 is not easily broken.

Figure 7A:
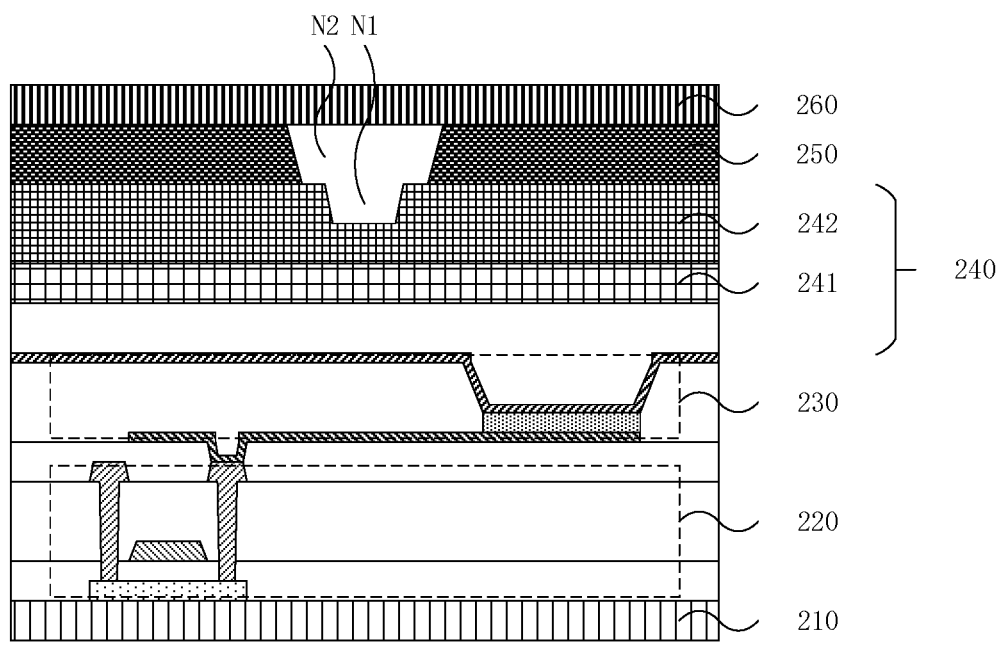
FIG. 7A and FIG. 7B each is a schematic diagram of yet another display panel structure 200 along AA' according to an embodiment of the present disclosure.
Figure 7B:
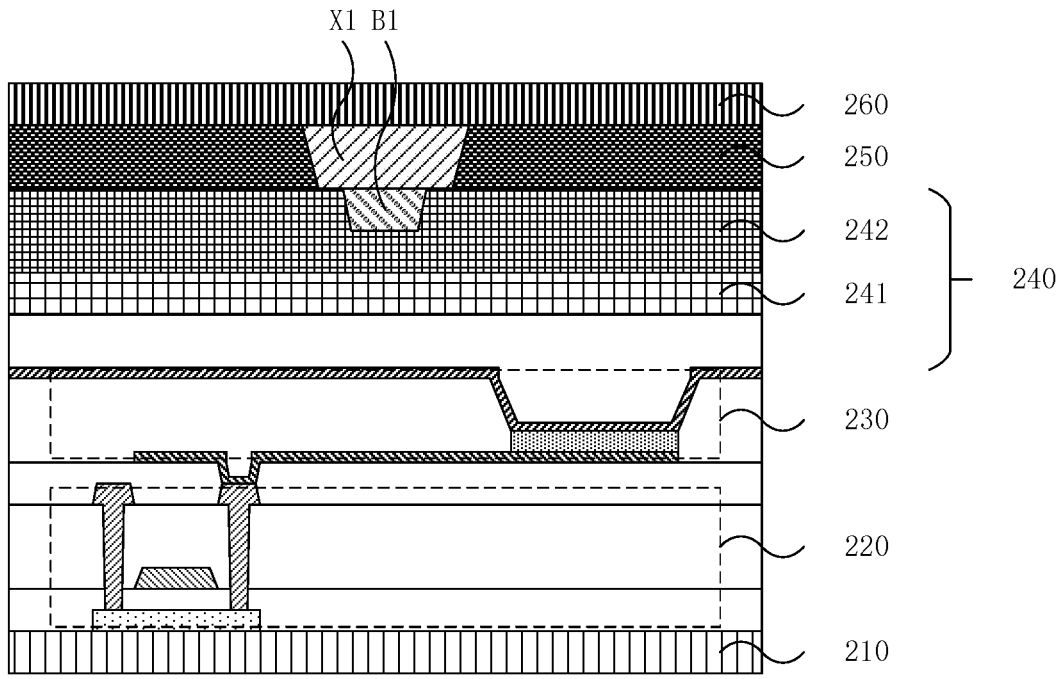

FIG. 7A and FIG. 7B each are a schematic diagram of yet another structure of the display panel 200 shown in FIG. 2 along AA' according to an embodiment of the present disclosure.

With reference to FIG. 2, FIG. 3, FIG. 7A and FIG. 7B, a structure of the edge display area A2 is as shown in FIG. 7A and FIG. 7B, and so is a structure of the central display area A1. However, a thickness of the organic encapsulation layer 241 located in the edge display area A2 is smaller than a thickness of the organic encapsulation layer 241 located in the central display area A1. The first touch electrode X1 is located in the second recessed structure N2, and the thickness of the first touch electrode X1 is equal to the depth of the second recessed structure N2.

In this embodiment of the present disclosure, the thickness of the first touch electrode X1 refers to a dimension of the first touch electrode X1 in a vertical direction of a bottom of the second recessed structure N2. The inorganic insulation layer 250 has the second recessed structure N2, and the first touch electrode X1 is located in the second recessed structure N2. The thickness of the first touch electrode X1 is equal to the depth of the second recessed structure N2. An upper surface of each of the first touch electrode X1 is substantially flush with an upper surface of the inorganic insulation layer 250. The first touch electrode X1 fills an entirety of the second recessed structure N2. The first touch electrode X1 prevents water and oxygen from accumulating in the second recessed structure N2.

Figure 8:
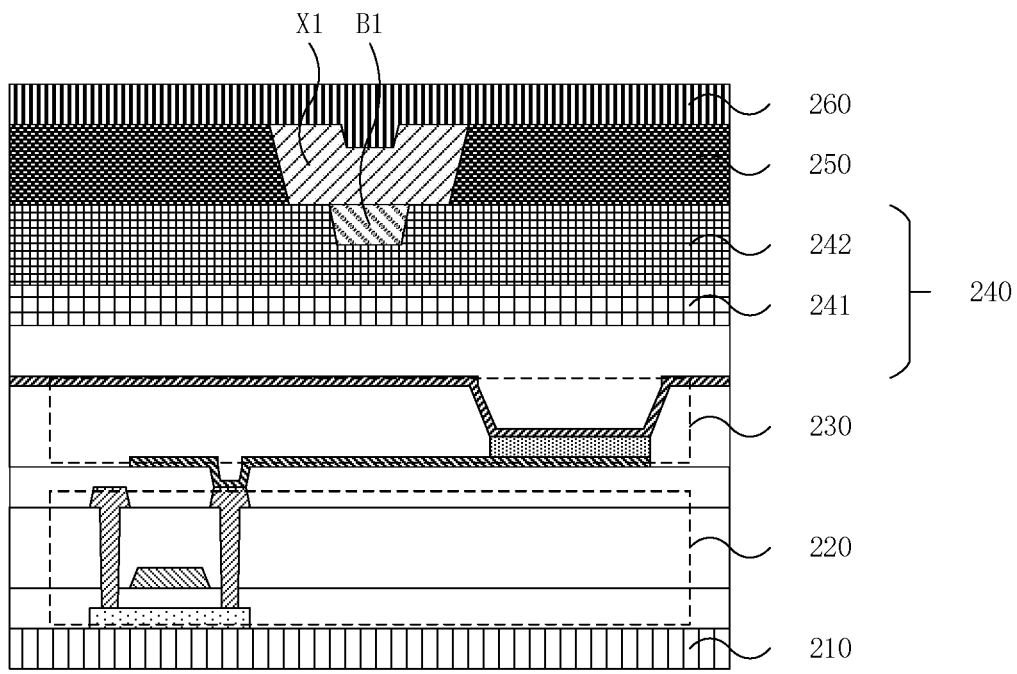
FIG. 8 is a schematic diagram of yet another display panel structure 200 shown in FIG. 2 along AA'.

FIG. 8 is a schematic diagram of yet another structure of the display panel 200 shown in FIG. 2 along AA' according to an embodiment of the present disclosure;

With reference to FIG. 3, FIG. 7A and FIG. 8, a structure of the edge display area A2 is as shown in FIG. 7A and FIG. 8, and so is a structure of the central display area A1. However, a thickness of the organic encapsulation layer 241 located in the edge display area A2 is smaller than a thickness of the organic encapsulation layer 241 located in the central display area A1. The first touch electrode X1 is located in the second recessed structure N2, and the thickness of the first touch electrode X1 is smaller than the depth of the second recessed structure N2.

In this embodiment of the present disclosure, the thickness of the first touch electrode X1 refers to a dimension of the first touch electrode X1 in a vertical direction of a bottom or a side wall of the second recessed structure N2. The inorganic insulation layer 250 has the second recessed structure N2. The first touch electrode X1 is located in the second recessed structure N2. The thickness of the first touch electrode X1 is smaller than the depth of the second recessed structure N2 instead of being equal to the depth of the second recessed structure N2. The first touch electrode X1 is of a U-shaped structure in the second recessed structure N2 instead of a straight line structure, a bottom portion of the U-shaped structure is equivalent to the entire straight line structure, and the U-shaped structure has two additional side portions compared with the straight line structure. The first touch electrode X1 has a large cross-sectional area and the first touch electrode X1 has a small electrical resistivity.

With reference to FIG. 3, FIG. 7A, FIG. 7B and FIG. 8, a structure of the edge display area A2 is as shown in FIG. 7A, FIG. 7B and FIG. 8, and so is a structure of the edge display area A2. However, a thickness of the organic encapsulation layer 241 located in the edge display area A2 is smaller than a thickness of the organic encapsulation layer 241 located in the central display area A1. The first bridge structure B1 is located in the first recessed structure N1, and the thickness of the first bridge structure B1 is equal to the depth of the first recessed structure N1.

In this embodiment of the present disclosure, the thickness of the first bridge structure B1 refers to a dimension of the first bridge structure B1 in a vertical direction of a bottom of the first recessed structure N1. The inorganic encapsulation layer 242 has the first recessed structure N1, and the inorganic insulation layer 250 has the second recessed structure N2. The first recessed structure N1 is connected to the second recessed structure N2. The first bridge structure B1 is located in the first recessed structure N1. The thickness of the first bridge structure B1 is equal to the depth of the first recessed structure N1. An upper surface of the first bridge structure B1 is flush with an upper surface of the inorganic encapsulation layer 242. The first touch electrode X1 is located in the second recessed structure N2. The first touch electrode X1 is located above the first bridge structure B1 and is in contact with the first bridge structure B1. All the first bridge structures B1 are embedded into the inorganic encapsulation layer 242, and have same cross-sectional areas and same mechanical strengths. All the first touch electrodes X1 are embedded into the inorganic insulation layer 250, and have same cross-sectional areas and same mechanical strengths.

In this embodiment of the present disclosure, the first bridge structure B1 is embedded into the inorganic encapsulation layer 242, and the first touch electrode X1 is embedded into the inorganic insulation layer 250, instead of being embedded into the inorganic encapsulation layer 242. A minimum distance between the inorganic insulation layer 250 and the driving circuit layer 220 is larger than a minimum distance between the inorganic encapsulation layer 242 and the driving circuit layer 220. A minimum distance between the first touch electrode X1 and the driving circuit layer 220 is larger than the minimum distance between the inorganic encapsulation layer 242 and the driving circuit layer 220. There is small mutual interference between the first touch electrode X1 and the driving circuit layer 220.

With reference to FIGS. 4A, 4B, 5A, 7A, 7B and 8, a structure of the edge display area A2 is as shown in FIGS. 4A, 4B, 5A, 7A, 7B and 8, and so is a structure of the central display area A1. However, a thickness of the organic encapsulation layer 241 located in the edge display area A2 is smaller than a thickness of the organic encapsulation layer 241 located in the central display area A1. The inorganic insulation layer 250 covers an entirety of the inorganic encapsulation layer 242.

In this embodiment of the present disclosure, the inorganic insulation layer 250 covers an entirety of the inorganic encapsulation layer 242. The inorganic encapsulation layer 242 covers an entirety of the driving circuit layer 220 and the organic light-emitting layer 230. The inorganic insulation layer 250 covers an entirety of the driving circuit layer 220 and the organic light-emitting layer 230. The inorganic insulation layer 250 prevents water and oxygen from eroding an entirety of the driving circuit layer 220 and the organic light-emitting layer 230.

With reference to FIGS. 4A, 4B, 5A, 7A, 7B and 8, a structure of the edge display area A2 is as shown in FIGS. 4A, 4B, 5A, 7A, 7B and 8, and so is a structure of the central display area A1. However, a thickness of the organic encapsulation layer 241 located in the edge display area A2 is smaller than a thickness of the organic encapsulation layer 241 located in the central display area A1. The display panel 200 further includes a covering layer 260 located at a side of the thin film encapsulation layer 240 facing away from the flexible substrate 210. The covering layer 260 covers the thin film encapsulation layer 240, the inorganic insulation layer 250, the first bridge structure B1 and the first touch electrode X1.

In this embodiment of the present disclosure, the covering layer 260 covers the thin film encapsulation layer 240, the inorganic insulation layer 250, the first bridge structure B1 and the first touch electrode X1. The covering layer 260 is located above the flexible substrate 210 to insulate and protect the first bridge structure B1, the first touch electrode X1, the inorganic insulation layer 250, the thin film encapsulation layer 240, the organic light-emitting layer 230, the driving circuit layer 220 and the like, while achieving planarization.

Figure 9:
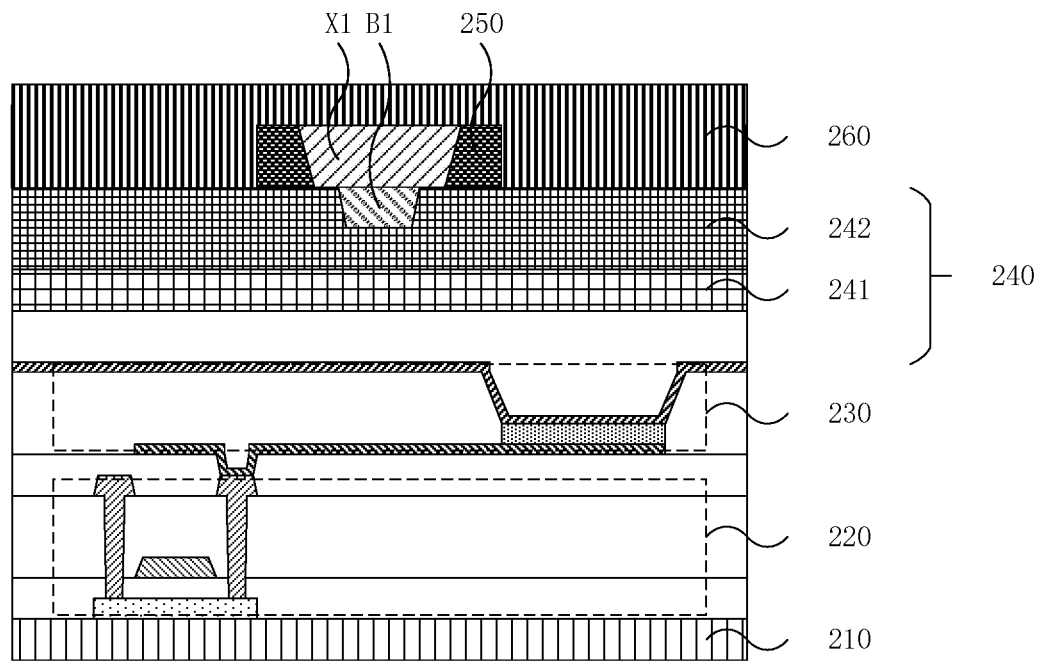
FIG. 9 is a schematic diagram of yet another display panel structure 200 shown in FIG. 2 along AA' according to an embodiment of the present disclosure.

FIG. 9 is a schematic diagram of yet another structure of the display panel 200 shown in FIG. 2 along AA' according to an embodiment of the present disclosure.

With reference to FIG. 3 and FIG. 9, a structure of the edge display area A2 is as shown in FIG. 9, and so is a structure of the central display area A1. However, a thickness of the organic encapsulation layer 241 located in the edge display area A2 is smaller than a thickness of the organic encapsulation layer 241 located in the central display area A1. The inorganic insulation layer 250 covers only a part of the inorganic encapsulation layer 242 close to the first recessed structure N1.

In this embodiment of the present disclosure, the inorganic insulation layer 250 covers the part of the inorganic encapsulation layer 242 close to the first recessed structure N1, without covering another part of the inorganic encapsulation layer 242 facing away from the first recessed structures N1. A surface area of the inorganic insulation layer 250 is smaller than a surface area of the inorganic encapsulation layer 242. The inorganic insulation layer 250 is subjected to a small force when being bent, and thus the inorganic insulation layer 250 is not easily broken.

Figure 10A:
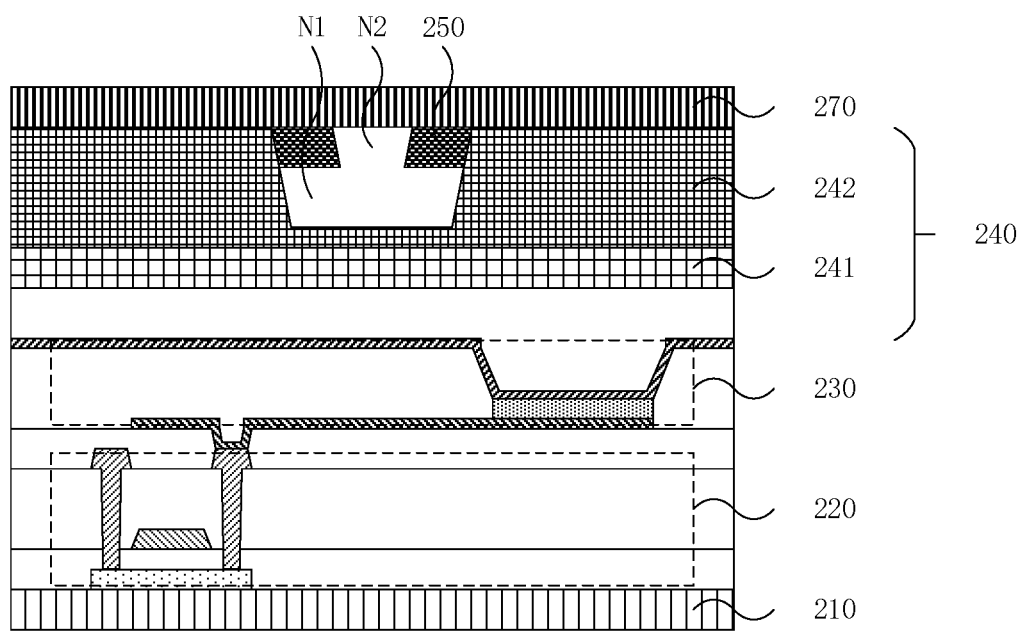
FIG. 10A and FIG. 10B each is a schematic diagram of yet another display panel structure 200 along AA' according to an embodiment of the present disclosure.
Figure 10B:
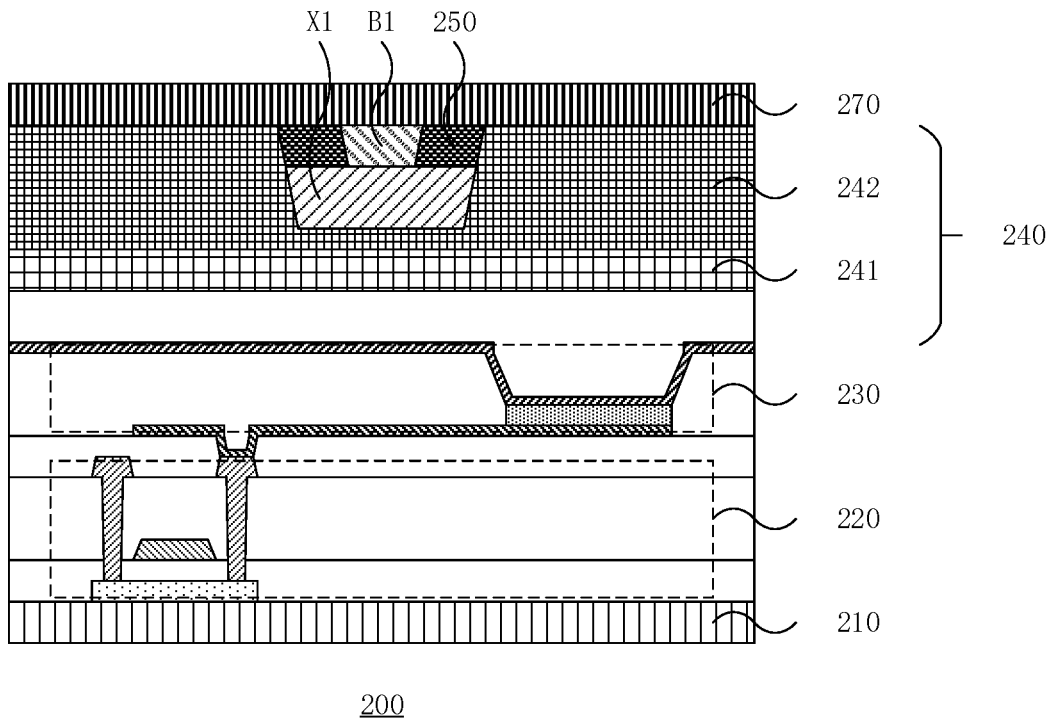

FIG. 10A and FIG. 10B each are a schematic diagram of yet another structure of the display panel 200 shown in FIG. 2 along AA' according to an embodiment of the present disclosure.

With reference to FIG. 3 and FIG. 10A, a structure of the edge display area A2 is as shown in FIG. 10A, and so is a structure of the central display area A1. However, a thickness of the organic encapsulation layer 241 located in the edge display area A2 is smaller than a thickness of the organic encapsulation layer 241 located in the central display area A1. The inorganic encapsulation layer 242 has the first recessed structure N1. A thickness of the inorganic encapsulation layer 242 is larger than the depth of the first recessed structure N1. The inorganic insulation layer 250 is located in the first recessed structure N1. The inorganic insulation layer 250 has the second recessed structure N2, and a thickness of the inorganic insulation layer 250 is equal to the thickness of the second recessed structure N2.

In this embodiment of the present disclosure, the inorganic encapsulation layer 242 has the first recessed structure N1, and the inorganic insulation layer 250 is located in the first recessed structure N1. The inorganic insulation layer 250 has the second recessed structure N2. Herein, the inorganic insulation layer 250 is embedded into the inorganic encapsulation layer 242 instead of covering the inorganic encapsulation layer 242. The inorganic insulation layer 250 and the inorganic encapsulation layer 242 are light and thin as a whole, and thus the display panel 200 is light and thin.

In this embodiment of the present disclosure, the inorganic encapsulation layer 242 has the first recessed structure N1, and the thickness of the inorganic encapsulation layer 242 is larger than the depth of the first recessed structure N1. The inorganic encapsulation layer 242 is closed at a bottom of the first recessed structure N1 to prevent water and oxygen, thereby preventing the inorganic encapsulation layer 242 from hollowing out at the first recessed structure N1. The inorganic insulation layer 250 is located in the first recessed structure N1 and has the second recessed structure N2. The thickness of the inorganic insulation layer 250 is equal to the depth of the second recessed structure N2 instead of being larger than the depth of the second recessed structure N2. The thickness of the inorganic insulation layer 250 is small, and thus the display panel 200 is light and thin.

With reference to FIG. 3, FIG. 10A and FIG. 10B, a structure of the edge display area A2 is shown in FIG. 10A and FIG. 10B, and so is a structure of the central display area A1. However, a thickness of the organic encapsulation layer 241 located in the edge display area A2 is smaller than a thickness of the organic encapsulation layer 241 located in the central display area A1. The first touch electrode X1 is located in the first recessed structure N1, and the first touch electrode X1 is close to a bottom of the first recessed structure N1. The inorganic insulation layer 250 is located between the first touch electrode X1 and an opening of the first recessed structure N1. The first bridge structure B1 is located in the second recessed structure N2.

In this embodiment of the present disclosure, the inorganic encapsulation layer 242 has the first recessed structure N1, and the first touch electrode X1 is located in the first recessed structure N1. The inorganic insulation layer 250 has the second recessed structure N2, and the first bridge structure B1 is located in the second recessed structure N2. All the first touch electrodes X1 are embedded into the organic encapsulation layer 242, and have same cross-sectional areas and same mechanical strengths. All the first bridge structures B1 are embedded into the inorganic insulation layer 250, and have same cross-sectional areas and same mechanical strengths. The first touch electrode X1 is close to a bottom of the first recessed structure N1 instead of being close to an opening of the first recessed structure N1. The inorganic insulation layer 250 is located between the first touch electrode X1 and the opening of the first recessed structure N1. The first bridge structure B1 reaches the opening of the first recessed structure N1. The thickness of the first bridge structure B1 is smaller than the thickness of the first touch electrode X1. A roughness of the first bridge structure B1 is smaller than a roughness of the first touch electrode X1. The first bridge structure B1 is relatively flat at the opening of the first recessed structure N1. An upper surface of the first bridge structure B1 is flush with an upper surface of the inorganic encapsulation layer 242. A polarizing layer 270 is disposed to be flat above the inorganic encapsulation layer 242 and the first bridge structure B1.

Figure 11A:
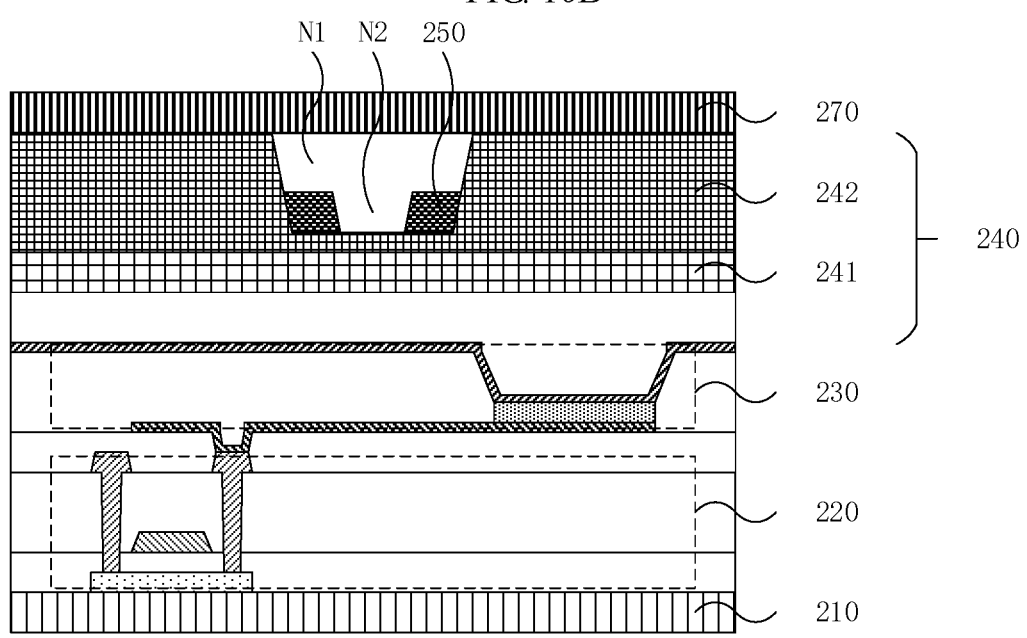
FIG. 11A and FIG. 11B each is a schematic diagram of yet another display panel structure 200 along AA' according to an embodiment of the present disclosure.
Figure 11B:
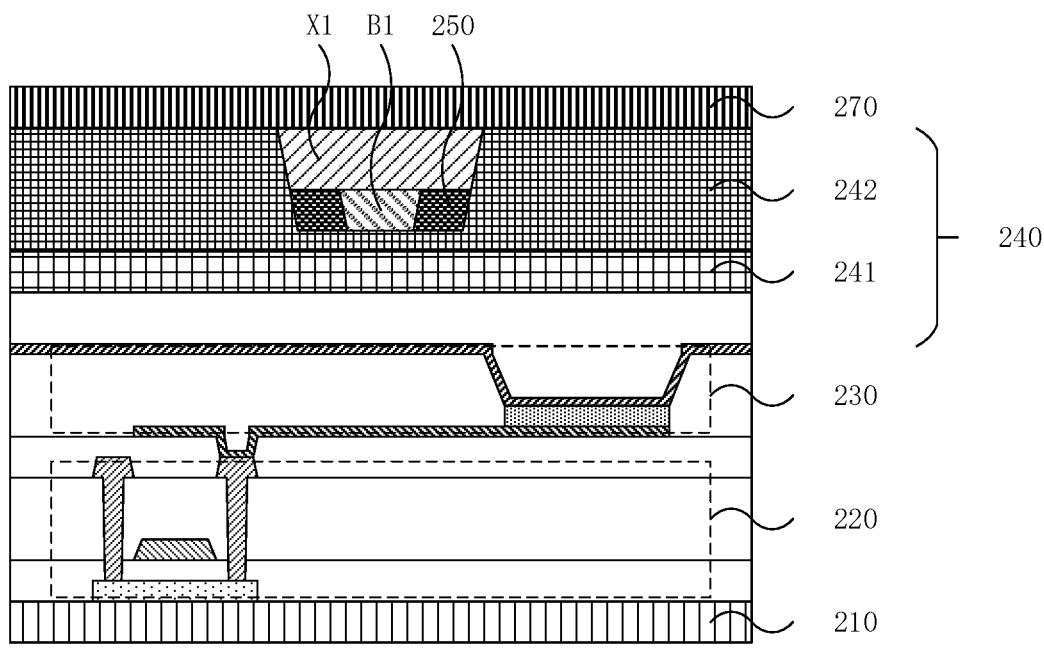

FIG. 11A and FIG. 11B each are a schematic diagram of yet another structure of the display panel 200 shown in FIG. 2 along AA' according to an embodiment of the present disclosure.

With reference to FIG. 3, FIG. 11A and FIG. 11B, a structure of the edge display area A2 is as shown in FIG. 11A and FIG. 11B, and so is a structure of the central display area A1. However, a thickness of the organic encapsulation layer 241 located in the edge display area A2 is smaller than a thickness of the organic encapsulation layer 241 located in the central display area A1. The first touch electrode X1 is located in the first recessed structure N1. The first touch electrode X1 is close to an opening of the first recessed structure N1. The inorganic insulation layer 250 is located between the first touch electrode X1 and a bottom of the first recessed structure N1. The first bridge structure B1 is located in the second recessed structure N2.

In this embodiment of the present disclosure, the inorganic encapsulation layer 242 has the first recessed structure N1, and the first touch electrode X1 is located in the first recessed structure N1. The inorganic insulation layer 250 has the second recessed structure N2, and the first bridge structure B1 is located in the second recessed structure N2. All the first touch electrodes X1 are embedded into the inorganic encapsulation layer 242, and have same cross-sectional areas and same mechanical strengths. All the first bridge structures B1 are embedded into the inorganic insulation layer 250, and have same cross-sectional areas and same mechanical strengths. The first touch electrode X1 is close to the opening of the first recessed structure N1 instead of being close to the bottom of the first recessed structure N1.a minimum distance between the opening of the first recessed structure N1 and the driving circuit layer 220 is larger than a minimum distance between the bottom of the first recessed structure N1 and the driving circuit layer 220. A minimum distance between the first touch electrode X1 and the driving circuit layer 220 is larger than a minimum distance between the bottom of the first recessed structure N1 and the driving circuit layer 220. There is small mutual interference between the first touch electrode X1 and the driving circuit layer 220.

With reference to FIGS. 3, 10A, 10B, 11A, and 11B, a structure of the edge display area A2 is as shown in FIGS. 10A, 10B, 11A, and 11B, and so is a structure of the central display area A1. However, a thickness of the organic encapsulation layer 241 located in the edge display area A2 is smaller than a thickness of the organic encapsulation layer 241 located in the central display area A1. The thickness of the first bridge structure B1 is equal to the depth of the second recessed structure N2. A sum of the thickness of the first touch electrode X1 and a thickness of the inorganic insulation layer 250 is equal to the depth of the first recessed structure N1.

In this embodiment of the present disclosure, the first bridge structure B1 is located in the second recessed structure N2, and the thickness of the first bridge structure B1 is equal to the depth of the second recessed structure N2. The inorganic insulation layer 250 and the first touch electrode X1 are located in the first recessed structure N1. The sum of the thickness of the first touch electrode X1 and the thickness of the inorganic insulation layer 250 is equal to the depth of the first recessed structure N1. The first bridge structure B1 fills an entirety of the second recessed structure N2. The first touch electrode X1, the first bridge structure B1 and the inorganic insulation layer 250 together fill the entirety of the first recessed structure N1. In this way, it prevents water and oxygen from accumulating in the first recessed structure N1, so as to facilitate disposing a polarizing layer 270 to be flat above the first recessed structure N1.

With reference to FIGS. 3, 10A, 10B, 11A, and 11B, a structure of the edge display area A2 is as shown in FIGS. 10A, 10B, 11A, and 11B, and so is a structure of the central display area A1. However, a thickness of the organic encapsulation layer 241 located in the edge display area A2 is smaller than a thickness of the organic encapsulation layer 241 located in the central display area A1. The display panel 200 further includes a polarizing layer 270 located at a side of the thin film encapsulation layer 240 facing away from the flexible substrate 210. The polarizing layer 270 covers the thin film encapsulation layer 240, the inorganic insulation layer 250, the first bridge structure B1 and the first touch electrode X1.

In this embodiment of the present disclosure, the polarizing layer 270 covers the thin film encapsulation layer 240, the inorganic insulation layer 250, the first bridge structure B1 and the first touch electrode X1. The polarizing layer 270 is located above the flexible substrate 210 to insulate and protect the first bridge structure B1, the first touch electrode X1, the inorganic insulation layer 250, the thin film encapsulation layer 240, the organic light-emitting layer 230, the driving circuit layer 220 and the like. No covering layer is arranged between the polarizing layer 270 and the thin film encapsulation layer 240. An overall thickness of the polarizing layer 270 and the thin film encapsulation layer 240 is smaller than a sum of the overall thickness of the polarizing layer 270 and the thin film encapsulation layer 240 and a thickness of the covering layer. In this case, the display panel 200 is light and thin.

With reference to FIGS. 3, 4B, 5A, 6, 7B, 8, 9, 10B, 11B, a structure of the edge display area A2 is as shown in FIGS. 3, 4B, 5A, 6, 7B, 8, 9, 10B, 11B, and so is a structure of the central display area A1. However, a thickness of the organic encapsulation layer 241 located in the edge display area A2 is smaller than a thickness of the organic encapsulation layer 241 located in the central display area A1. The thickness of the first touch electrode X1 is larger than 390 nm and smaller than 410 nm. The thickness of the first bridge structure B1 is larger than 240 nm and smaller than 260 nm.

In this embodiment of the present disclosure, the thickness of the first touch electrode X1 is larger than 390 nm, and the thickness of the first bridge structure B1 is larger than 240 nm. The first touch electrode X1 and the first bridge structure B1 have the small electrical resistivity, and the first touch electrode X1 and the first bridge structure B1 have the small touch signal attenuation. Further, the thickness of the first touch electrode X1 is smaller than 410 nm, and the thickness of the first bridge structure B1 is smaller than 260 nm. The first touch electrode X1 and the first bridge structure B1 are subjected to the small force when being bent, and the first touch electrode X1 and the first bridge structure B1 are not easily broken.

Figure 12A:
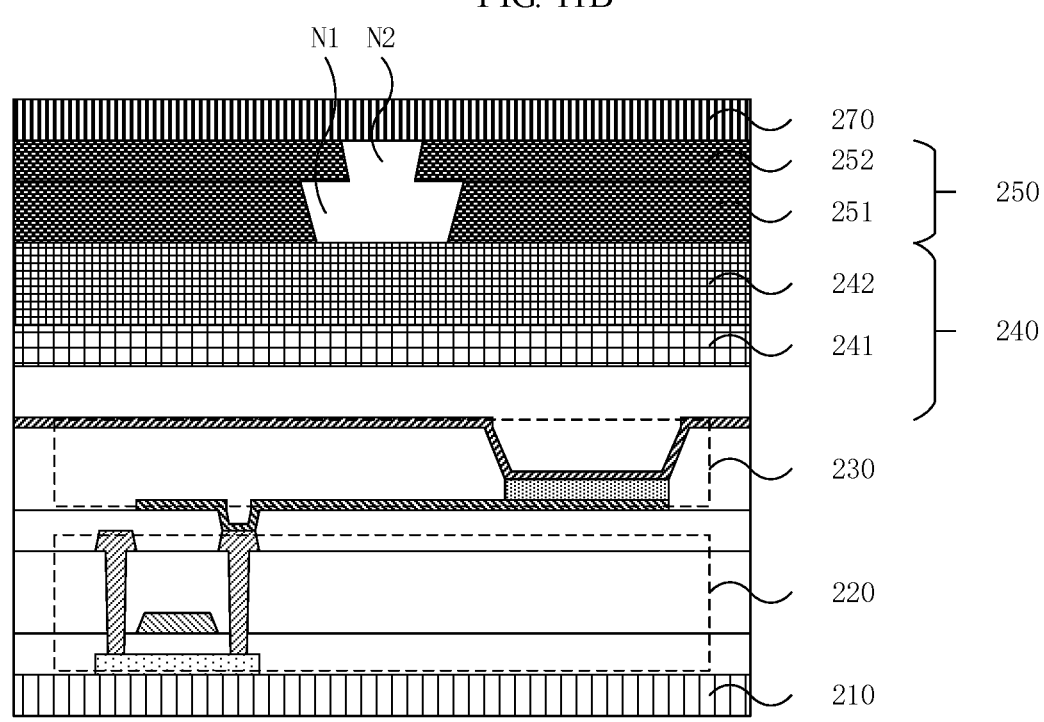
FIG. 12A and FIG. 12B each is a schematic diagram of yet another structure of the display panel 200 along AA' according to an embodiment of the present disclosure.
Figure 12B:
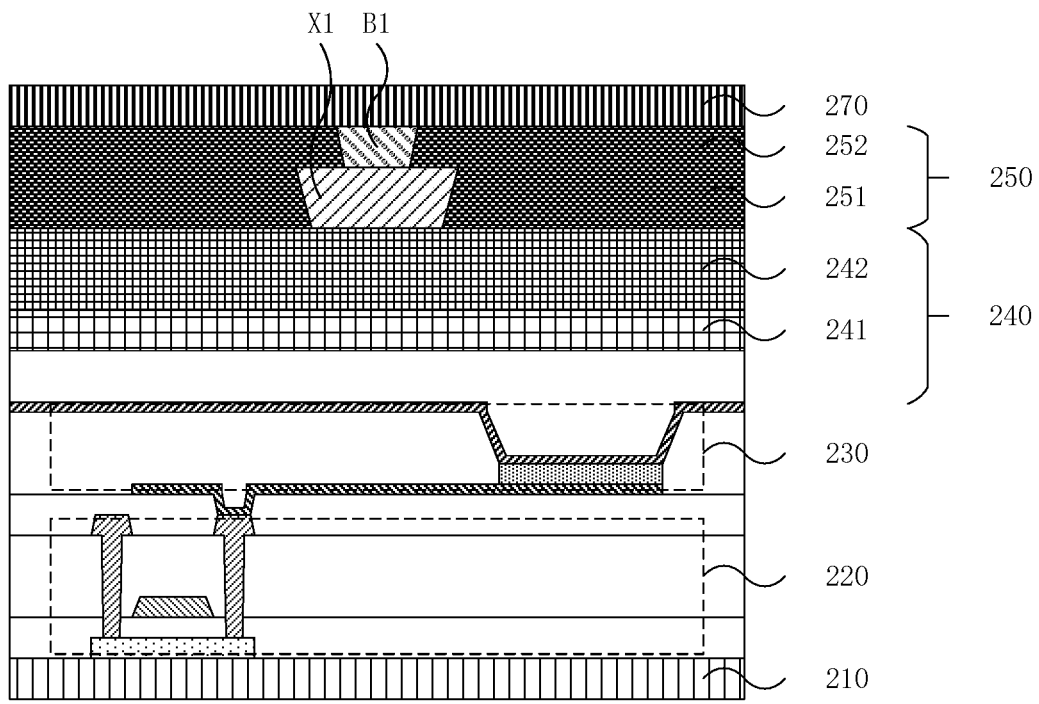

FIG. 12A and FIG. 12B each are a schematic diagram of yet another structure of the display panel 200 shown in FIG. 2 along AA' according to an embodiment of the present disclosure.

With reference to FIG. 3 and FIG. 12A, a structure of the edge display area A2 is as shown in FIG. 12A, and so is a structure of the central display area A1. However, a thickness of the organic encapsulation layer 241 located in the edge display area A2 is smaller than a thickness of the organic encapsulation layer 241 located in the central display area A1. The inorganic insulation layer 250 includes a first inorganic insulation layer 251 and a second inorganic insulation layer 252 that are adjacent to each other. The first inorganic insulation layer 251 has the first recessed structure N1, and the second inorganic insulation layer 252 has the second recessed structure N2. A thickness of the first inorganic insulation layer 251 is equal to the thickness of the first recessed structure N1, and a thickness of the second inorganic insulation layer 252 is equal to the depth of the second recessed structure N2.

In this embodiment of the present disclosure, the inorganic insulation layer 250 includes the first inorganic insulation layer 251 and the second inorganic insulation layer 252 that are adjacent to each other. The first inorganic insulation layer 251 has the first recessed structure N1, and the second inorganic insulation layer 252 has the second recessed structure N2. Here, the inorganic insulation layer 250 includes two film layers, instead of one film layer or being embedded into the inorganic encapsulation layer 242, thereby resulting in a large thickness. The inorganic insulation layer 250 herein has an excellent effect of preventing water and oxygen.

In this embodiment of the present disclosure, the first inorganic insulation layer 251 has the first recessed structure N1, and the second inorganic insulation layer 252 has the second recessed structure N2. The thickness of the first inorganic insulation layer 251 is equal to the depth of the first recessed structure N1 instead of being larger than the depth of the first recessed structure N1. The thickness of the second inorganic insulation layer 252 is equal to the depth of the second recessed structure N2 instead of being larger than the depth of the second recessed structure N2. The first inorganic insulation layer 251 has a small thickness, and the second inorganic insulation layer 252 has a small thickness. In this way, the display panel 200 is light and thin.

With reference to FIG. 3, FIG. 12A and FIG. 12B, a structure of the edge display area A2 is as shown in FIG. 12A and FIG. 12B, and so is a structure of the central display area A1. However, a thickness of the organic encapsulation layer 241 located in the edge display area A2 is smaller than a thickness of the organic encapsulation layer 241 located in the central display area A1. The first touch electrode X1 is located in the first recessed structure N1, and the thickness of the first touch electrode X1 is equal to the depth of the first recessed structure N1.

In this embodiment of the present disclosure, the first inorganic insulation layer 251 has the first recessed structure N1. The first touch electrode X1 is located in the first recessed structure N1. All the first touch electrodes X1 are embedded into the first inorganic insulation layer 251, and have same cross-sectional areas and same mechanical strengths. The thickness of the first touch electrode X1 is equal to the depth of the first recessed structure N1. The first touch electrodes X1 fills an entirety of the first recessed structure N1. In this way, it prevents water and oxygen from accumulating in the first recessed structure N1.

With reference to FIG. 3, FIG. 12A and FIG. 12B, a structure of the edge display area A2 is as shown in FIG. 12A and FIG. 12B, and so is a structure of the central display area A1. However, a thickness of the organic encapsulation layer 241 located in the edge display area A2 is smaller than a thickness of the organic encapsulation layer 241 located in the central display area A1. The first bridge structure B1 is located in the second recessed structure N2, and the thickness of the first bridge structure B1 is equal to the depth of the second recessed structure N2.

In this embodiment of the present disclosure, the second inorganic insulation layer 252 has the second recessed structure N2, and the first bridge structure B1 is located in the second recessed structure N2. All the first bridge structures B1 are embedded into the second inorganic insulation layer 252, and have same cross-sectional areas and same mechanical strengths. The thickness of the first bridge structure B1 is equal to the depth of the second recessed structure N2. The first bridge structures B1 fills an entirety of the second recessed structure N2. In this way, it can prevent water and oxygen from accumulating in the second recessed structure N2.

With reference to FIG. 3, FIG. 12A and FIG. 12B, a structure of the edge display area A2 is as shown in FIG. 12A and FIG. 12B, and so is a structure of the central display area A1. However, a thickness of the organic encapsulation layer 241 located in the edge display area A2 is smaller than a thickness of the organic encapsulation layer 241 located in the central display area A1. The first touch electrode X1 is embedded into the first inorganic insulation layer 251, and the first bridge structure B1 is embedded into the second inorganic insulation layer 252. The first inorganic insulation layer 251 and the first touch electrode X1 are close to the thin film encapsulation layer 240. The second inorganic insulation layer 252 and the first bridge structure B1 are close to the polarizing layer 270. The thickness of the first bridge structures B1 is smaller than the thickness of the first touch electrode X1. A roughness of the first bridge structure B1 is smaller than a roughness of the first touch electrode X1. An upper surface of the first bridge structure B1 is relatively flat and flush with the second inorganic insulation layer 252. The polarizing layer 270 is disposed to be flat above the second inorganic insulation layer 252 and the first bridge structure B1.

Figure 13A:
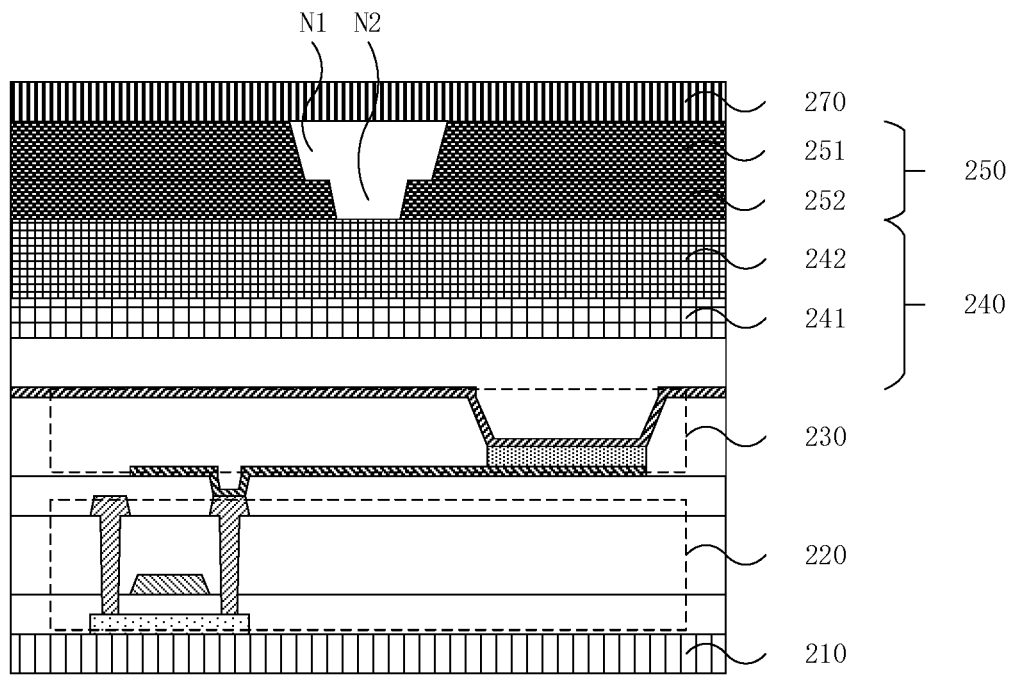
FIG. 13A and FIG. 13B each is a schematic diagram of yet another display panel structure 200 along AA' according to an embodiment of the present disclosure.
Figure 13B:
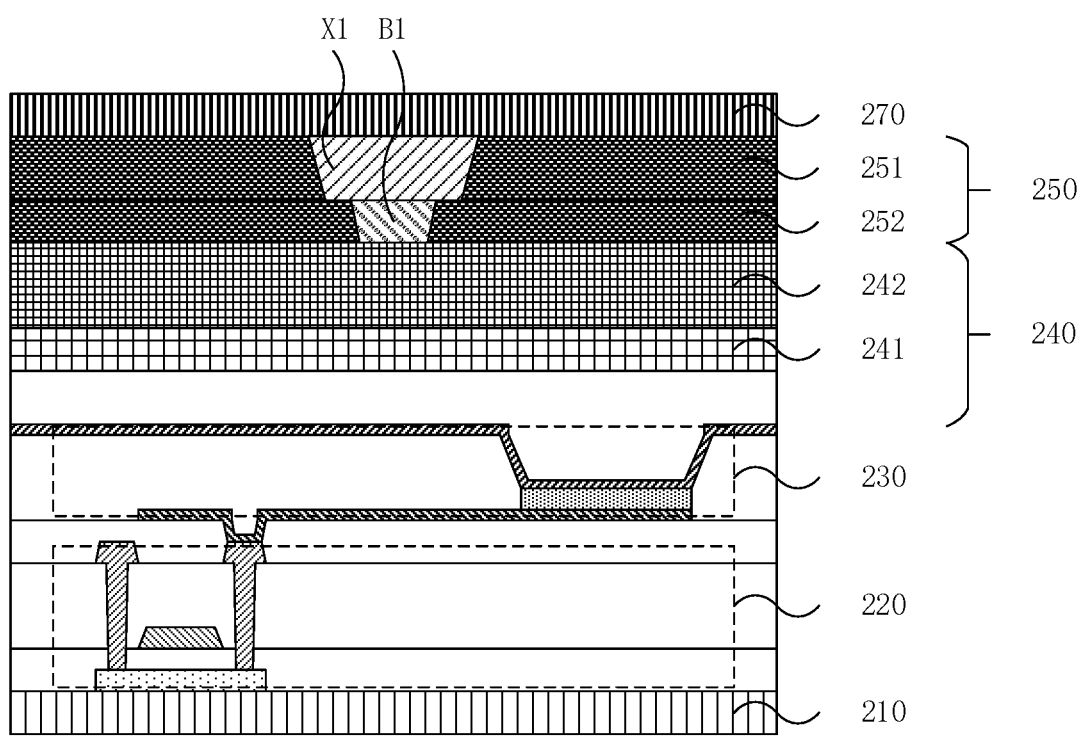

FIG. 13A and FIG. 13B each are a schematic diagram of yet another structure of the display panel 200 shown in FIG. 2 along AA' according to an embodiment of the present disclosure. With reference to FIG. 13A and FIG. 13B, a structure of the edge display area A2 is as shown in FIG. 13A and FIG. 13B, and so is a structure of the central display area A1. However, a thickness of the organic encapsulation layer 241 located in the edge display area A2 is smaller than a thickness of the organic encapsulation layer 241 located in the central display area A1. The first touch electrode X1 is embedded into the first inorganic insulation layer 251, and the first bridge structure B1 is embedded into the second inorganic insulation layer 252. The second inorganic insulation layer 252 and the first bridge structure B1 are close to the thin film encapsulation layer 240. The first inorganic insulation layer 251 and the first touch electrode X1 are close to the polarizing layer 270. A minimum distance between the first inorganic insulation layer 251 and the driving circuit layer 220 is larger than a minimum distance between the second inorganic insulation layer 252 and the driving circuit layer 220. A minimum distance between the first touch electrode X1 and the driving circuit layer 220 is larger than the minimum distance between the second inorganic insulation layer 252 and the driving circuit layer 220. There is small mutual interference between the first touch electrode X1 and the driving circuit layer 220.

With reference to FIGS. 3, 12A, 12B, 13A, and 13B, a structure of the edge display area A2 is as shown in FIGS. 12A, 12B, 13A and 13B, and so is a structure of the central display area A1. However, a thickness of the organic encapsulation layer 241 located in the edge display area A2 is smaller than a thickness of the organic encapsulation layer 241 located in the central display area A1. The display panel 200 further includes polarizing layer 270 located at a side of the inorganic insulation layer 250 facing away from the flexible substrate 210. The polarizing layer 270 covers the inorganic insulation layer 250, the thin film encapsulation layer 240, the first bridge structure B1 and the first touch electrode X1.

In this embodiment of the present disclosure, the polarizing layer 270 covers the inorganic insulation layer 250, the thin film encapsulation layer 240, the first bridge structure B1 and the first touch electrode X1. The polarizing layer 270 is disposed above the flexible substrate 210 to insulate and protect the first bridge structure B1, the first touch electrode X1, the inorganic insulation layer 250, the thin film encapsulation layer 240, the organic light-emitting layer 230, the driving circuit layer 220 and the like. No covering layer is arranged between the polarizing layer 270 and the inorganic insulation layer 250. An overall thickness of the polarizing layer 270 and the inorganic insulation layer 250 is smaller than a sum of the overall thickness of the polarizing layer 270 and the inorganic insulation layer 250 and a thickness of the covering layer. In this case, the display panel 200 is light and thin.

With reference to FIGS. 3, 12A, 12B, 13A, and 13B, a structure of the edge display area A2 is as shown in FIGS. 12A, 12B, 13A and 13B, and so is a structure of the central display area A1. However, a thickness of the organic encapsulation layer 241 located in the edge display area A2 is smaller than a thickness of the organic encapsulation layer 241 located in the central display area A1. The thickness of the first touch electrode X1 is larger than 390 nm and smaller than 410 nm, and the thickness of the first bridge structure B1 is larger than 130 nm and smaller than 150 nm.

In this embodiment, the thickness of the first touch electrode X1 is larger than 390 nm, and the thickness of the first bridge structure B1 is larger than 130 nm. The first touch electrode X1 and the first bridge structure B1 have the small electrical resistivity, and the first touch electrode X1 and the first bridge structure B1 have the small touch signal attenuation. Further, the thickness of the first touch electrode X1 is smaller than 410 nm, and the thickness of the first bridge structure B1 is smaller than 150 nm. The first touch electrode X1 and the first bridge structure B1 are subjected to the small force when being bent, and thus the first touch electrode X1 and the first bridge structure B1 are not easily broken. Furthermore, the thickness of the first bridge structure B1 is smaller than 150 nm, and the first bridge structure B1 has a small roughness. In this way, the polarizing layer 270 can be disposed to be flat above the first bridge structure B1.

Figure 14:
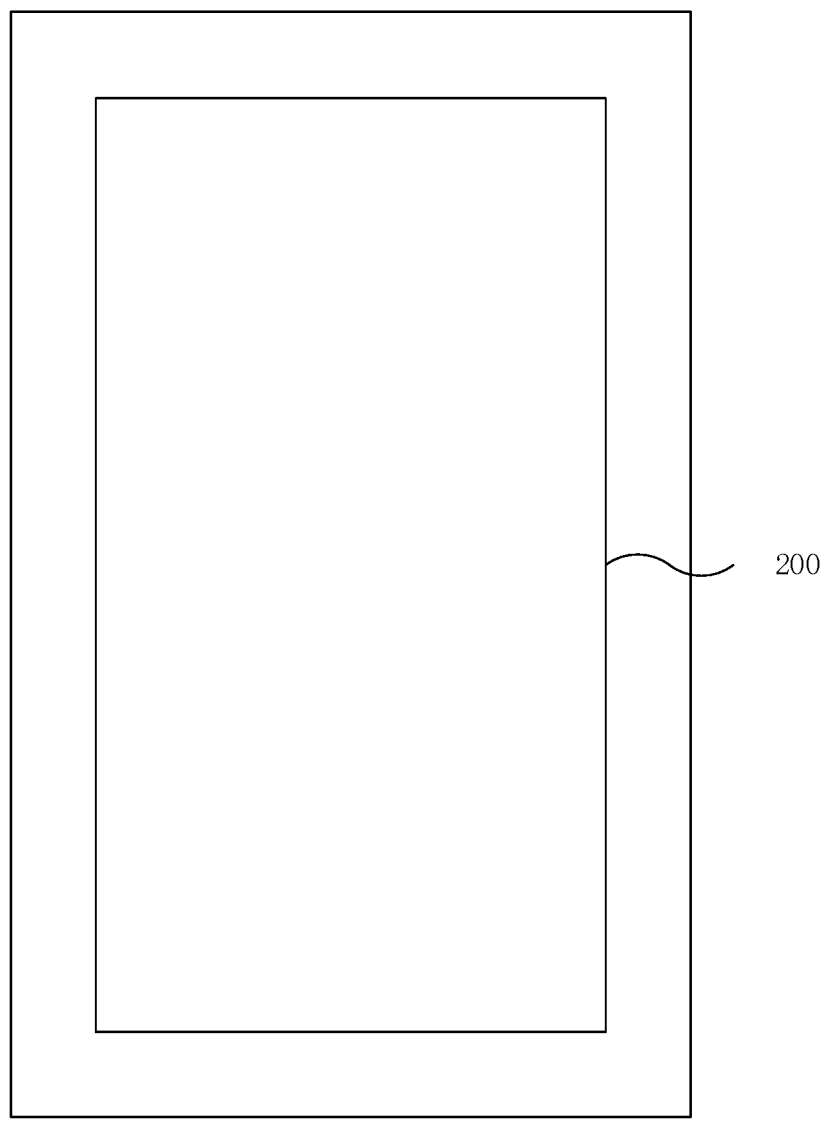
FIG. 14 is a schematic diagram of a structure of a display device 300 according to an embodiment of the present disclosure.

FIG. 14 is a schematic diagram of a structure of a display device 300 according to an embodiment of the present disclosure.

With reference to FIG. 14, the display panel 300 includes a display panel 200.

In an embodiment of the present disclosure, the display device 300 can implement a touch function. For example, the display device 300 may be a smart cellphone or a similar display device. The display panel 200 has been described above and will not be further described herein.

In summary, an embodiment of the present disclosure provides a display panel and a display device. The display panel includes a flexible substrate, a driving circuit layer, an organic light-emitting layer, a thin film encapsulation layer, and an inorganic insulation layer that are sequentially stacked. The thin film encapsulation layer includes an organic encapsulation layer and an inorganic encapsulation layer covering the organic encapsulation layer. The inorganic encapsulation layer is adjacent to the inorganic insulation layer. The inorganic encapsulation layer has a first recessed structure. The inorganic insulation layer has a second recessed structure that is connected to the first recessed structure. Alternatively, the inorganic insulation layer has the first recessed structure and the second recessed structure that are connected to each other. The display panel further includes a first touch electrode located in the first recessed structure and a first bridge structure located in the second recessed structure. Alternatively, the display panel further includes the first bridge structure located in the first recessed structure and the first touch electrode located in the second recessed structure. The first touch electrode serves as a touch driving electrode or a touch sensing electrode. Two first touch electrodes are electrically connected to each other through one first bridge structure. In this embodiment of the present disclosure, the first touch electrode is not easily broken.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

What is claimed is:

1. A display panel, comprising:
a flexible substrate;
a driving circuit layer disposed on the flexible substrate;
an organic light-emitting layer disposed on the driving circuit layer;
a thin film encapsulation layer disposed on the organic light-emitting layer and comprising an organic encapsulation layer and an inorganic encapsulation layer covering the organic encapsulation layer;
an inorganic insulation layer disposed on the thin film encapsulation layer;
first recessed structures and second recessed structures, one of the second recessed structures being connected to one of the first recessed structures;
first touch electrodes; and
first bridge structures,
wherein the first recess structures each are formed in the inorganic encapsulation layer and the second recess structures each are formed in the inorganic insulation layer; or
wherein the first recessed structures and the second recessed structures are formed in the inorganic insulation layer;
wherein each of the first touch electrodes is located in one of the first recessed structures and wherein each of the first bridge structures is located in one of the second recessed structures, or wherein each of the first bridge structures is located in one of the first recessed structures and each of the first touch electrodes is located in one of the second recessed structures;

wherein each of the first touch electrodes serves as a touch driving electrode or a touch sensing electrode; and wherein two of the first touch electrodes are electrically connected to each other through one of the first bridge structures.

2. The display panel according to claim 1, wherein the inorganic insulation layer is located on a top surface of the inorganic encapsulation layer;

wherein if the first recessed structures are provided in the inorganic encapsulation layer, and the second recessed structures are provided in the inorganic insulation layer, a thickness of the inorganic encapsulation layer is larger than a depth of each of the first recessed structures, and a thickness of the inorganic insulation layer is equal to a depth of each of the second recessed structures.

3. The display panel according to claim 2, wherein if each of the first touch electrodes is located in one of the first recessed structures, a thickness of each of the first touch electrodes is equal to or smaller than a depth of the said one of the first recessed structures.

4. The display panel according to claim 3, wherein each of the first bridge structures is located in one of the second recessed structures, or each of the first bridge structures is located in one of the first recessed structures and one of the second recessed structures; and a thickness of each of the first bridge structures is equal to a depth of said one of the second recessed structures.

5. The display panel according to claim 2, wherein if each of the first touch electrodes is located in one of the second recessed structures, a thickness of each of the first touch electrodes is equal to or smaller than a depth of the respective one of the second recessed structures.

6. The display panel according to claim 5, wherein if each of the first bridge structures is located in one of the first recessed structures, a thickness of each of the first bridge structure is equal to a depth of said one of the first recessed structures.

7. The display panel according to claim 1, wherein if the first recessed structures are provided in the inorganic encapsulation layer, a thickness of the inorganic encapsulation layer is larger than a depth of each of the first recessed structures;

wherein if the first recessed structures and the second recessed structures are provided in the inorganic insulation layer, a thickness of the inorganic insulation layer is equal to a depth of each of the second recessed structures.

8. The display panel according to claim 7, wherein each of the first touch electrodes is located at bottom of one of the first recessed structures, and the inorganic insulation layer is located between one of the first touch electrodes and an opening of one of the first recessed structures; and wherein each of the first bridge structures is located in one of the second recessed structures.

9. The display panel according to claim 7, wherein each of the first touch electrodes is located at an opening of one of the first recessed structures wherein the inorganic insulation layer is located between the first touch electrodes and a bottom of one of the first recessed structures; and wherein each of the first bridge structures is located in one of the second recessed structures.

10. The display panel according to claim 8, wherein a thickness of one of the first bridge structures is equal to a depth of one of the second recessed structures, and a sum of a thickness of each of the first touch electrodes and a thickness of the inorganic insulation layer is equal to a depth of one of the first recessed structures.

11. The display panel according to claim 9, wherein a thickness of one of the first bridge structures is equal to a depth of one of the second recessed structures, and a sum of a thickness of one of the first touch electrodes and a thickness of the inorganic insulation layer is equal to a depth of one of the first recessed structures.

12. The display panel according to claim 7, further comprising a polarizing layer located on top of the thin film encapsulation layer facing away from the flexible substrate, wherein the polarizing layer covers the thin film encapsulation layer, the inorganic insulation layer, the first bridge structures, and the first touch electrodes.

13. The display panel according to claim 1, wherein the inorganic insulation layer comprises a first inorganic insulation layer and a second inorganic insulation layer disposed on the first inorganic insulation layer;

if the first recessed structures and the second recessed structures are both formed in the inorganic insulation layer, wherein the first recessed structures are provided in the first inorganic insulation layer, and the second recessed structures are provided in the second inorganic insulation layer, wherein a thickness of the first inorganic insulation layer is equal to a depth of one of the first recessed structures, and a thickness of the second inorganic insulation layer is equal to a depth of one of the second recessed structures.

14. The display panel according to claim 13, wherein each of the first touch electrodes is located in one of the first recessed structures, and a thickness of each of the first touch electrodes is equal to a depth of said first recessed structure.

15. The display panel according to claim 14, wherein each of the first bridge structures is located in one of the second recessed structures, and a thickness of each of the first bridge structures is equal to a depth of said second recessed structure.

16. The display panel according to claim 1, wherein the display panel has a central display area and an edge display area surrounding the central display area;

wherein a portion of the organic encapsulation layer is located in the edge display area and another portion of the organic encapsulation layer is located in the central display area; and wherein a ratio of a thickness of the portion of the organic encapsulation layer located in the edge display area to a thickness of the other portion of the organic encapsulation layer located in the central display area is larger than 0.5 and smaller than 1.

17. The display panel according to claim 16, wherein the inorganic encapsulation layer and the inorganic insulation layer are located in both the central display area and the edge display area;

wherein each of the first touch electrodes has a same width or a same thickness in the central display area and in the edge display area; and wherein each of the first bridge structures has a same width or a same thickness in the central display area and in the edge display area.

18. The display panel according to claim 1, further comprising second touch electrodes and second bridge structures, wherein two of the second touch electrodes are electrically connected to each other through one of the second bridge structures;

wherein the first touch electrodes and the second touch electrodes are located in a same film layer;

wherein each of the first bridge structures crosses one of the second bridge structures; and wherein each of the first touch electrodes serves as a touch driving electrode and each of the second touch electrodes serves as a touch sensing electrode.

19. The display panel according to claim 18, wherein the first touch electrodes and the second touch electrodes form a metal mesh.

20. A display device, comprising the display panel according to claim 1.

\* \* \* \* \*